US012645000B2

(12) United States Patent
Danielsson et al.

(10) Patent No.: US 12,645,000 B2
(45) Date of Patent: Jun. 2, 2026

(54) 3D SEMICONDUCTOR DETECTOR SYSTEM

(71) Applicant: SiSnap AB, Stockholm (SE)

(72) Inventors: Mats Danielsson, Täby (SE); Luca Terenzi, Solna (SE)

(73) Assignee: SiSnap AB, Stockholm (SE)

( * ) Notice: Subject to any disclaimer, the term of this patent is extended or adjusted under 35 U.S.C. 154(b) by 199 days.

(21) Appl. No.: 18/669,740

(22) Filed: May 21, 2024

(65) Prior Publication Data

US 2025/0362418 A1     Nov. 27, 2025

(51) Int. Cl.
| | |
|---|---|
| *G01T 1/24* | (2006.01) |
| *H04N 25/78* | (2023.01) |
| *H04N 25/79* | (2023.01) |
| *H10F 39/18* | (2025.01) |

(52) U.S. Cl.
CPC .............. *G01T 1/247* (2013.01); *G01T 1/242* (2013.01); *H04N 25/78* (2023.01); *H04N 25/79* (2023.01); *H10F 39/1895* (2025.01)

(58) Field of Classification Search
CPC ....... G01T 1/247; G01T 1/242; G01T 1/2907; H04N 25/78; H04N 25/79; H10F 39/1895
See application file for complete search history.

(56) References Cited

U.S. PATENT DOCUMENTS

| | | | |
|---|---|---|---|
| 7,800,070 | B2 | 9/2010 | Weinberg et al. |
| 8,120,683 | B1 | 2/2012 | Turner et al. |
| 10,636,834 | B2 | 4/2020 | Meylan et al. |

| | | | |
|---|---|---|---|
| 11,647,973 | B2 | 5/2023 | Vija et al. |
| 11,817,518 | B2 | 11/2023 | Iacobucci et al. |
| 2012/0112087 | A1 | 5/2012 | Yokoi |
| 2013/0026380 | A1 | 1/2013 | Tkaczyk et al. |
| 2015/0331115 | A1* | 11/2015 | Nelson .................. G01T 1/1614 |
| | | | 250/366 |
| 2016/0157791 | A1 | 6/2016 | Shizukuishi |

(Continued)

FOREIGN PATENT DOCUMENTS

| | | |
|---|---|---|
| WO | 2008/003351 A1 | 1/2008 |
| WO | 2022/249115 A2 | 12/2022 |

OTHER PUBLICATIONS

Cadoux et al., "The 100uPET project: A small-animal PET scanner for ultra-high resolution molecular imaging with monolithic silicon pixel detectors", Nuclear Inst. and Methods in Physics Research, A 1048 (2023) 167952.

(Continued)

*Primary Examiner* — Kiho Kim
(74) *Attorney, Agent, or Firm* — Morgan, Lewis & Bockius LLP

(57)     ABSTRACT

A detector system for molecular imaging of a radionuclide comprises a 3D semiconductor detector comprising a plurality of sensor stacks of sensors made of a semiconductor material having an average atomic number Z below 40. A read-out circuitry connected to the pixels is configured to output, for each interaction induced by an incident gamma ray in the detector, a signal representative of a time, a position and an energy of the interaction in the detector. The interactions in the detector belonging to a same event induced by the incident gamma ray are predicted based on the output signals and used to estimate a direction of the incident gamma ray and reconstruct an image based on the estimated directions of incident gamma rays.

28 Claims, 19 Drawing Sheets

(56)                References Cited

U.S. PATENT DOCUMENTS

2017/0367665 A1    12/2017  Schlecht et al.
2020/0158663 A1     5/2020  Danielsson

OTHER PUBLICATIONS

Caputo et al., "The All-sky Medium Energy Gamma-ray Observatory eXplorer (AMEGO-X) Mission Concept", J. Astron. Telesc Instrum. Syst. 2022 8(4): 044003-1.

Cartier et al., "Micrometer-resolution imaging using MÖNCH: towards G2-less grating interferometry", J. Synchrotron Rad. (2016) 23, 1462-1473.

Corradino et al., "Design and Characterization of Backside Termination Structures for Thick Fully-Depleted MAPS", Sensors (2021) 21, 3809. https//doi.org/10.3390/s21113809.

Corradino et al., "Charge Collection Dynamics of the ARCADIA Passive Pixel Arrays: Laser Characterization and TCAD Modeling", Front. Phys. (2022) 10: 929251.

Corradino et al, "ARCADIA MAPS process qualification through the electrical characterization of passive pixel arrays", Journal of Instrumentation (2023) 18: C02045.

Corradino et al, "Simulation and first characterization of MAPS test structures with gain for timing applications", Journal of Instrumentation (2024) 19: C02036.

Daniel et al., "Application of a deep learning algorithm to Compton imaging of radioactive point sources with a single planar CdTe pixelated detector", Nuclear Engineering and Technology, 54 (2022) 1747-1753.

De Cilladi et al., "Fully Depleted Monolithic Active Microstrip Sensors: TCAD Simulation Study of an Innovative Design Concept", Sensors (2021) 21: 1990.

Matscheko et al., "Compton spectroscopy in the diagnostic X-ray energy range: II. Effects of scattering material and energy resolution", Phys. Med. Biol. 1989 34(2):199-208.

Kozani et al., "Machine learning-based event recognition in SiFi Compton camera imaging for proton therapy monitoring", Phys. Med. Biol. 2022 67: 155012.

Kroeger et al. "Three-Compton Telescope: Theory, Simulations, and Performance", IEEE Transactions on Nuclear Science, vol. 49, No. 4, pp. 1887-1892, Aug. 2002.

Lee et al., "Evaluation of sequence tracking methods for Compton cameras based on CdZnTe arrays", Nuclear Engineering and Technology 53 (2021) pp. 4080-4092.

Lehner et al, "4pi Compton Imaging Using a 3-D Position-Sensitive CdZnTe Detector Via Weighted List-Mode Maximum Likelihood", IEEE Transactions on Nuclear Science, vol. 51, No. 4, pp. 1618-1624, Aug. 2004.

Li et al., "A feasibility study of PETiPIX: an ultra high resolution small animal PET scanner", 2013 JINST. 8 P12004.

Martin et al., "A Ring Compton Scatter Camera for Imaging Medium Energy Gamma Rays", IEEE Transactions on Nuclear Science, 1993 40(4): 972-978.

Maxim et al., "Analytical inversion of the Compton transform using the full set of available projections", Inverse Problems, 2009 25(9): 095001.

Maxim, "Filtered Backprojection Reconstruction and Redundancy in Compton Camera Imaging", IEEE Transactions on Image Processing, 2014 23(1): 332-341.

Mi et al., "A stacked prism lens concept for next-generation hard X-ray telescopes", Nature Astronomy 2019 3: 867-872.

Neubüser et al., Sensor design optimization of innovative low-power, large area FD-MAPS for HEP and applied science, Front. Phys. (2021) 9: 625401.

Neubüser et al., "Impact of X-ray induced radiation damage on FD-MAPS of the ARCADIA project", Journal of Instrumentation (2022) 17: C01035.

Neubüser et al., "ARCADIA FD-MAPS: Simulation, characterization and perspectives for high resolution timing applications", Nuclear Inst. and Methods in Physics Research, A (2023) 1048: 167946.

Neubüser et al., "First characterization results of ARCADIA FD-MAPS after X-ray irradiation", Journal of Instrumentation (2023) 18: C01066.

Ordonez et al., "Angular Uncertainties due to Geometry and Spatial Resolution in Compton Cameras", 1998 IEEE Nuclear Science Symposium Conference Record. 1998 IEEE Nuclear Science Symposium and Medical Imaging Conference (Cat. No. 98CH36255), Toronto, ON, Canada, 1998, vol. 3, pp. 1535-1540.

Pancheri et al., "Design of CMOS Monolithic Avalanche Detectors for charged-particle timing with sub-nanosecond resolution", IEEE Eurocon 2023—20th International Conference on Smart Technologies, Jul. 6-8, 2023.

Peric et al., "High-Voltage CMOS Active Pixel Sensor", IEEE Journal of Solid-State Circuits, 2021 56(8): 2488-2502.

Sgouros et al., "Radiopharmaceutical therapy in cancer: clinical advances and challenges", Nature Reviews Drug Discovery, 2020 19: 589-608.

Sundberg et al., "1-$\mu$m spatial resolution in silicon photon-counting CT detectors", J. Med. Imag. 2021 8(6): 063501.

Sundberg et al., "Compton coincidence in silicon photon-counting CT detectors", Journal of Medical Imaging, vol. 9 (1), 013501-1-013501-30, Jan./Feb. 2022.

Takashima et al, "Event reconstruction of Compton telescopes using a multi-task neural network", Nuclear Inst. and Methods in Physics Research, A 1038 (2022) 166897.

Tashenov et al., "TANGO—New tracking AlGOrithm for gamma-rays", Nuclear Instruments and Methods in Physics Research A 622 (2010) 592-601.

Tian et al, "Radiopharmaceutical imaging based on 3D-CZT Comtpon camera with 3D-printed mouse phantom", Physica Medica 96 (2022) 140-148.

Uenomachi et al., "Simultaneous in vivo imaging with PET and SPECT tracers using a Compton-PET hybrid camera", Scientific Reports, 11, 17933 (2021). https://doi.org/10.1038/s41598-021-97302-7.

Valerio et al., "A monolithic ASIC demonstrator for the Thin Time-of-Flight PET scanner", 2019 JINST 14 P07013.

Wilderman et al., "List-Mode Maximum Likelihood Reconstruction of Compton Scatter Camera Images in Nuclear Medicine", IEEE Conference Record of Nuclear Science Symposium 1998 3: 1716-1720.

Yao et al., "Technical note: Rapid and high-resolution deep learning-based radiopharmaceutical imaging with 3D-CZT Compton camera and sparse projection data", Med Phys. (2022) 49: 7336-7346.

Yoneda et al., "Reconstruction of multiple Compton scattering events in MeV gamma-ray Compton telescopes towards GRAMS: The physics-based probabilistic model", Astroparticle Physics 144 (2023) 102765.

Zambito et al., "20 ps time resolution with a fully-efficient monolithic silicon pixel detector without internal gain layer", 2023 JINST 18 P03047.

Oecd, "PENELOPE 2018: A code system for Monte Carlo simulation of electron and photon transport", Workshop Proceedings, Barcelona, Spain, Jan. 28-Feb. 1, 2019. Paris: Organisation for Economic Co-operation and Development, 2019.

Sundberg et al., "Silicon photon-counting detector for full-field CT using an ASIC with adjustable shaping time", Journal of Medical Imaging, 2020, 7(5): 053503.

International Search Report and Written Opinion issued in International Patent Application No. PCT/SE2025/050459 dated Jul. 9, 2025.

Sundberg et al., "Compton coincidence in silicon photon-counting CT detectors," Journal of Medical Imaging, 9 (1): 013501-1-013501-30 (Jan./Feb. 2022).

* cited by examiner 3D semiconductor detector field of view

SPECT field of view

3D SEMICONDUCTOR DETECTOR SYSTEM

TECHNICAL FIELD

The present invention generally relates to a three-dimensional (3D) semiconductor detector system for molecular imaging of radioactive nuclides, and in particular such a 3D semiconductor detector system with outstanding efficiency and high spatial resolution.

BACKGROUND

In molecular imaging, radiolabeled biologically relevant probes are used as tracers, also referred to as radiotracers, to map biological function and processes in the body. To measure the location of the radioactive nuclides, also referred to as radionuclides, radioisotopes or radioactive isotopes in the art, the incident direction of the detected photons needs to be measured. For this, in positron emission tomography (PET), two 511 keV photons from the positron annihilation are detected in time coincidence and the radionuclide is assumed to be on the line between the two points where the photons were detected. In single photon emission computed tomography (SPECT), the individual photons emitted from the radionuclide must pass through a collimator with holes that define the allowed incident directions. The detector positioned behind the collimator determines the detected position of the small fraction of the photons that make it through the collimator.

Both PET and SPECT are widely used for clinical imaging and for research, each having its own advantages and challenges. For instance, PET is fundamentally limited in resolution due to the positron range (0.5-6 mm) and requires expensive cyclotrons in the vicinity to produce the radionuclides. The problem with SPECT systems is the mechanical collimator, which is very inefficient, rejecting most of the photons that carry information about the object, with only about 1 out of 10 000-100000 photons passed to the detector. The collimators used in SPECT systems have an unfortunate built-in trade-off between efficiency and spatial resolution, limiting the latter to around 10 mm.

There is therefore a need for a detector system that can be used for molecular imaging of radioactive nuclides and that is not marred by the shortcomings of existing PET and SPECT systems.

SUMMARY

It is a general objective a detector system having high efficiency and spatial resolution.

This and other objectives are met by embodiments disclosed herein.

An aspect of the invention relates to a detector system for molecular imaging of a radionuclide. The detector system comprises a three-dimensional (3D) semiconductor detector comprising a plurality of sensor stacks. Each sensor stack of the plurality of sensor stacks comprises a plurality of semiconductor sensors each comprising a plurality of pixels. The plurality of semiconductor sensors is made of a semiconductor material having an average atomic number Z below 40. The detector system also comprises a read-out circuitry connected to the pixels in the 3D semiconductor detector and configured to output a pixel value from a pixel in a semiconductor sensor of the 3D semiconductor detector if the pixel value exceeds a cutoff threshold and if the pixel and at least one adjacent pixel in the semiconductor sensor both detect an interaction within a defined time interval. Pixel values are representative of a respective energy deposited at a pixel by an interaction induced by an incident gamma ray in the 3D semiconductor detector. The detector system further comprises at least one processor and at least one memory comprising instructions, which when executed by the at least one processor, cause the at least one processor to predict, based on the pixel values output by the read-out circuitry, the interactions in the 3D semiconductor detector belonging to a same event induced by the incident gamma ray. The at least one processor is also caused to estimate, based on the predicted interactions in the 3D semiconductor detect belonging to the same event, a direction of the incident gamma ray inducing the same event. The at least one processor is further caused to reconstruct an image based on the estimated directions of incident gamma rays.

The detector system is able to record all possible chains of interactions induced by incident gamma rays in the semiconductor material of the 3D semiconductor sensor. This is possible by the particular read-out circuitry of the detector system that is capable of detecting such interactions using a low cutoff threshold and still reducing the risk of noise counts inducing false detections in the 3D semiconductor detector. This means, together with a high probability for interaction in the semiconductor material, that the detector system will have a higher efficiency and spatial resolution as compared to prior art detector systems for molecular imaging of radionuclides.

BRIEF DESCRIPTION OF THE DRAWINGS

The embodiments, together with further objects and advantages thereof, may best be understood by referring to the following description taken together with the accompanying drawings, in which.

DETAILED DESCRIPTION

The present invention generally relates to a 3D semiconductor detector system for molecular imaging of radioactive nucleotides, and in particular such a 3D semiconductor detector system with outstanding efficiency and high spatial resolution.

Figure 12:
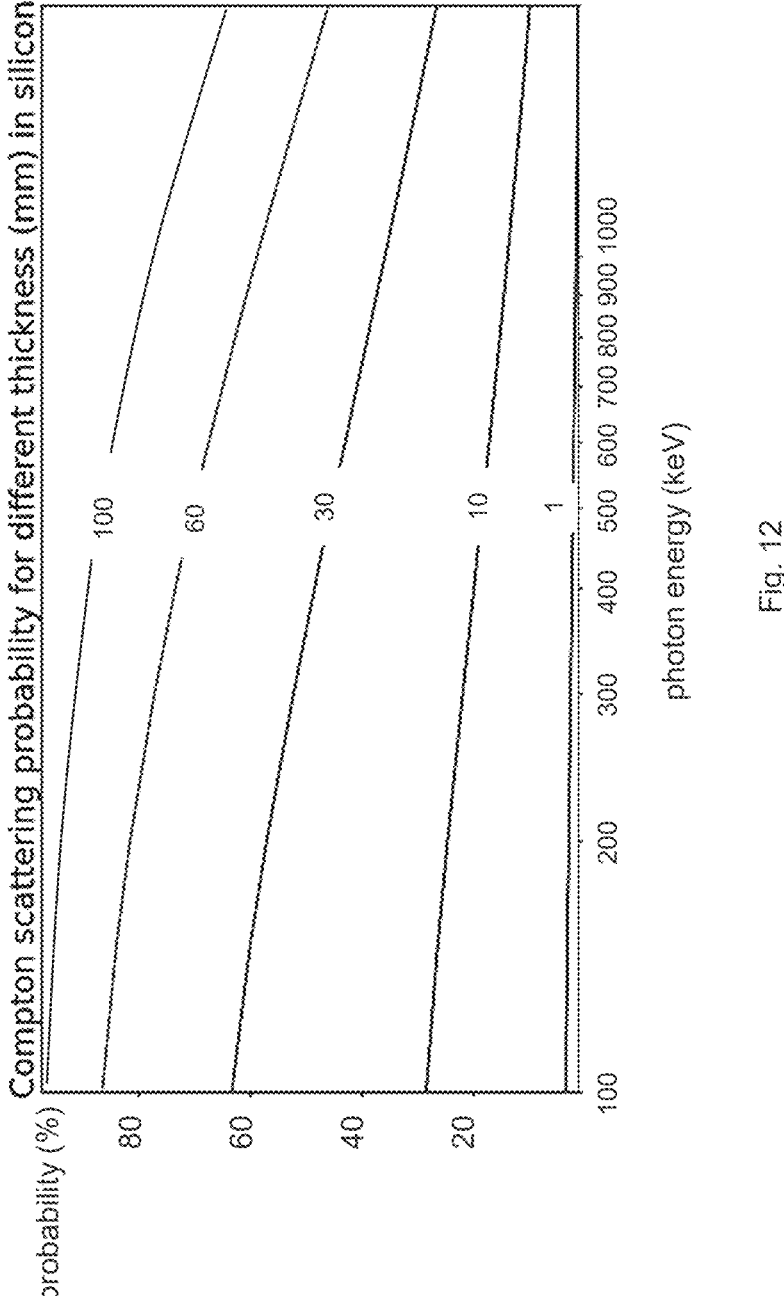
FIG. 12 illustrates a graph of the probability for one or more Compton interactions for different detector thicknesses and incident photon energies based on GEANT4 simulations.

The present invention relates to a 3D semiconductor detector and a detector system for molecular imaging of radioactive nuclides, such as in the human body. The 3D semiconductor detector comprises a block of semiconductor material built up from a multitude of semiconductor sensors, with high resolution in space, energy and time. The 3D semiconductor detector is able to record all incident gamma rays that interact in the semiconductor volume of the 3D semiconductor detector, which for practical thicknesses of the semiconductor material will be of the order 50% over a wide energy range (FIG. 12). This is many orders of magnitude higher compared to the collimator-based state-of-the art SPECT systems ($10^{-6}$), see Table 3.

The detector system is able to record all possible chains of interactions, including one or several Compton scatter interactions, also referred to as Compton effect interactions or simply Compton interactions in the art, i.e., the photon scattering following an interaction with a charged particle, typically an electron, in the semiconductor material of the 3D semiconductor sensor, followed by absorption by photoelectric effect or escape. This is, together with the high probability for Compton scatter according to FIG. 12, the reason for the higher efficiency of the detector system of the invention as compared to prior art detector systems, see Table 3. Moreover, given the high resolution for energy and position in the 3D semiconductor detector, the detector system will be limited in system resolution mainly by the so-called Doppler broadening (Matscheko et al., 1989; Martin et al., 1993; Ordonez et al., 1998), corresponding to the uncertainty in the assumption that the Compton recoil electrons in the Compton scatter interactions are perfectly at rest. This translates to a position resolution at 10 cm distance of 3.8 mm for 140 keV and <1 mm for 511 keV. This means that on top of increased efficiency, the detector system of the invention offers a significant improvement in spatial resolution over state of the art.

Generally, there is a need to have the cutoff threshold for the pixels in the 3D semiconductor detector as low as possible to not miss detection of any Compton scatter interactions in the 3D semiconductor detector, which would otherwise reduce the high efficiency of the detector system. However, noise in the 3D semiconductor detector puts a lower limit to the cutoff threshold as otherwise noise would cause false detections by the detector system.

Figure 21:
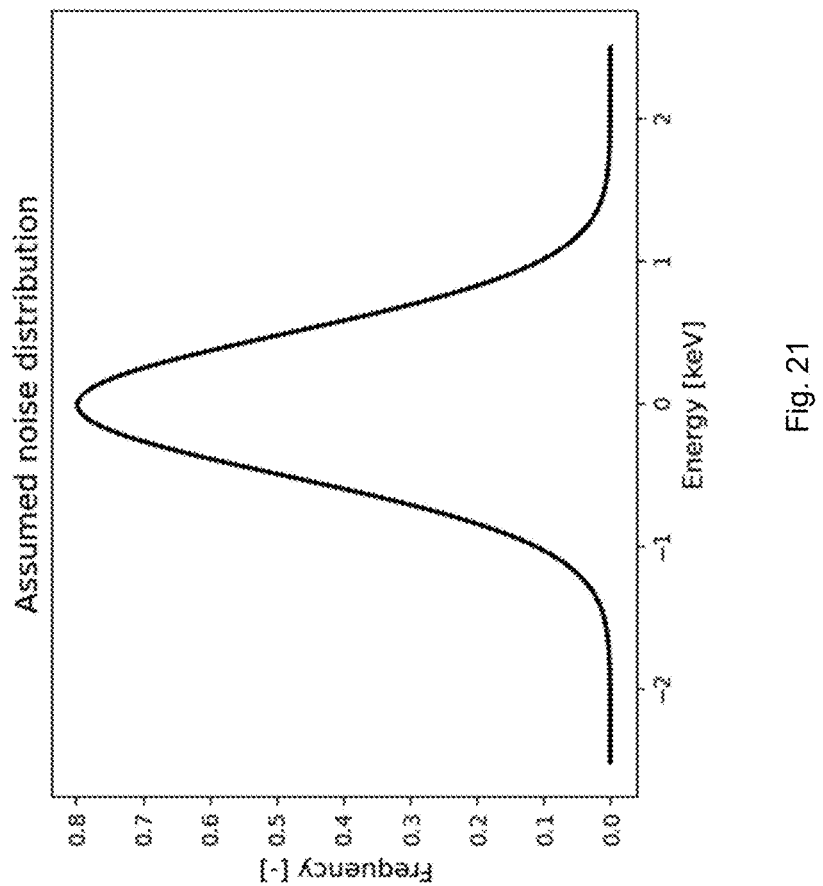
FIG. 21 illustrates a normal distribution of read-out noise, having a zero mean and a standard deviation of 0.5 keV.

The noise in the 3D semiconductor detector is typically Gaussian distributed (normal distribution). FIG. 21 illustrates an example of a normal distribution of read-out noise for a 3D semiconductor detector, having a zero mean and a standard deviation of 0.5 keV. The noise is, however, uncorrelated from pixel to pixel. This is used together with insights that a real Compton scatter interaction will almost always affect multiple adjacent pixels in a semiconductor sensor of the 3D semiconductor detector. This is utilized by the read-out circuitry of the detector system to suppress noise counts by requiring that at least two adjacent pixels in a semiconductor sensor are "hit" to qualify as a Compton scatter interaction.

Such an approach will not work when the rate of real Compton scatter interactions is so high that real events will indeed cause hits in adjacent pixels. Experimental data as presented herein shows that there is a linear relationship between time resolution and the number of time coincident events, see FIG. 18, i.e., two or more different photons interacting in the 3D semiconductor detector in a time interval smaller than the time resolution of the detector system. Further, the number of activated pixels in the 3D semiconductor detector remained orders of magnitude smaller than the total number of pixels in the 3D semiconductor detector, see Table 5. Thus, in a real-world application of the detector system only a minor fraction of the pixels will be hit within a time interval, which means that the read-out circuitry of the invention is an efficient means for suppressing noise events for a given cutoff threshold.

Figure 1:
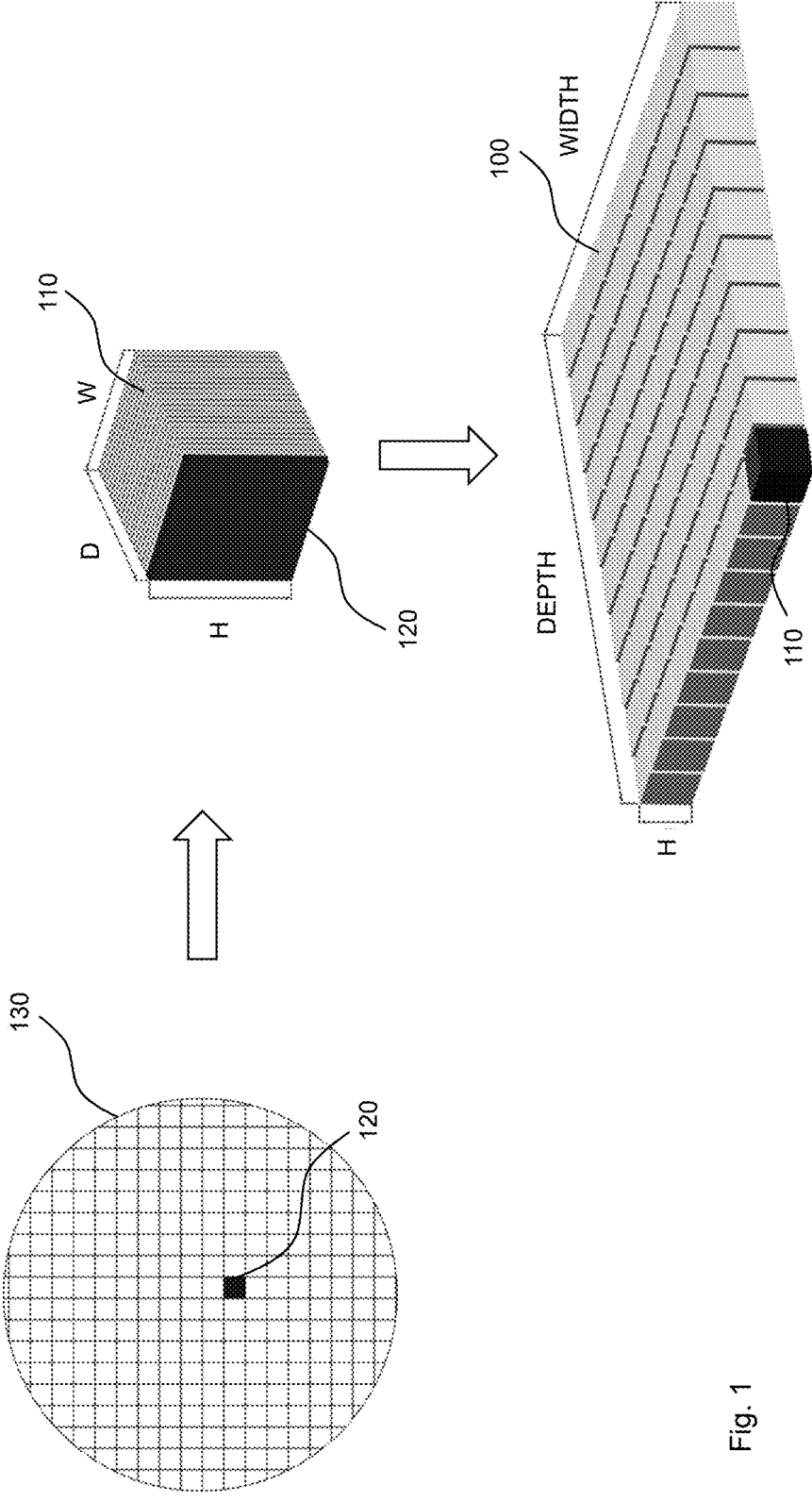
FIG. 1 schematically illustrates an embodiment of assembling a 3D semiconductor detector.
Figure 3:
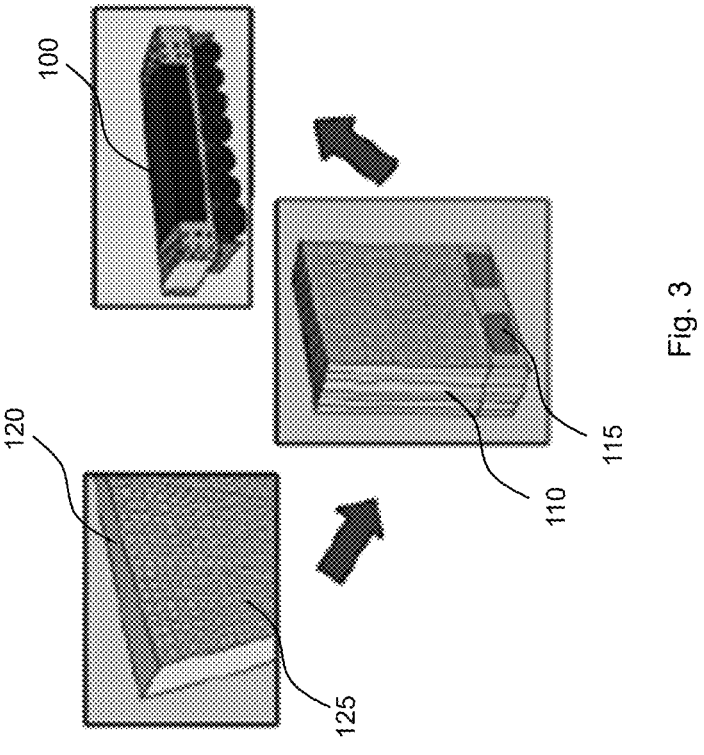
FIG. 3 schematically illustrates the outline of assembly of the 3D semiconductor detector starting with individual semiconductor sensors put into modules with power and data connection, which are assembled into the 3D semiconductor detector with cooling and ready for mechanical and electrical integration into a gantry.
Figure 4:
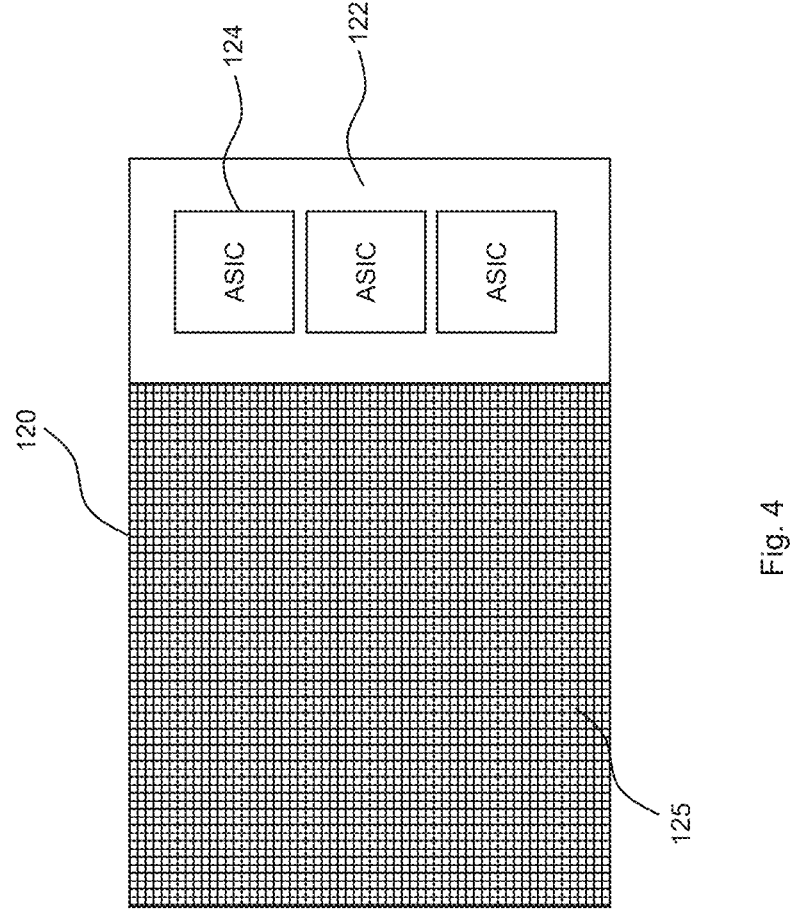
FIG. 4 is an illustration of a hybrid semiconductor sensor according to an embodiment.
Figure 5:
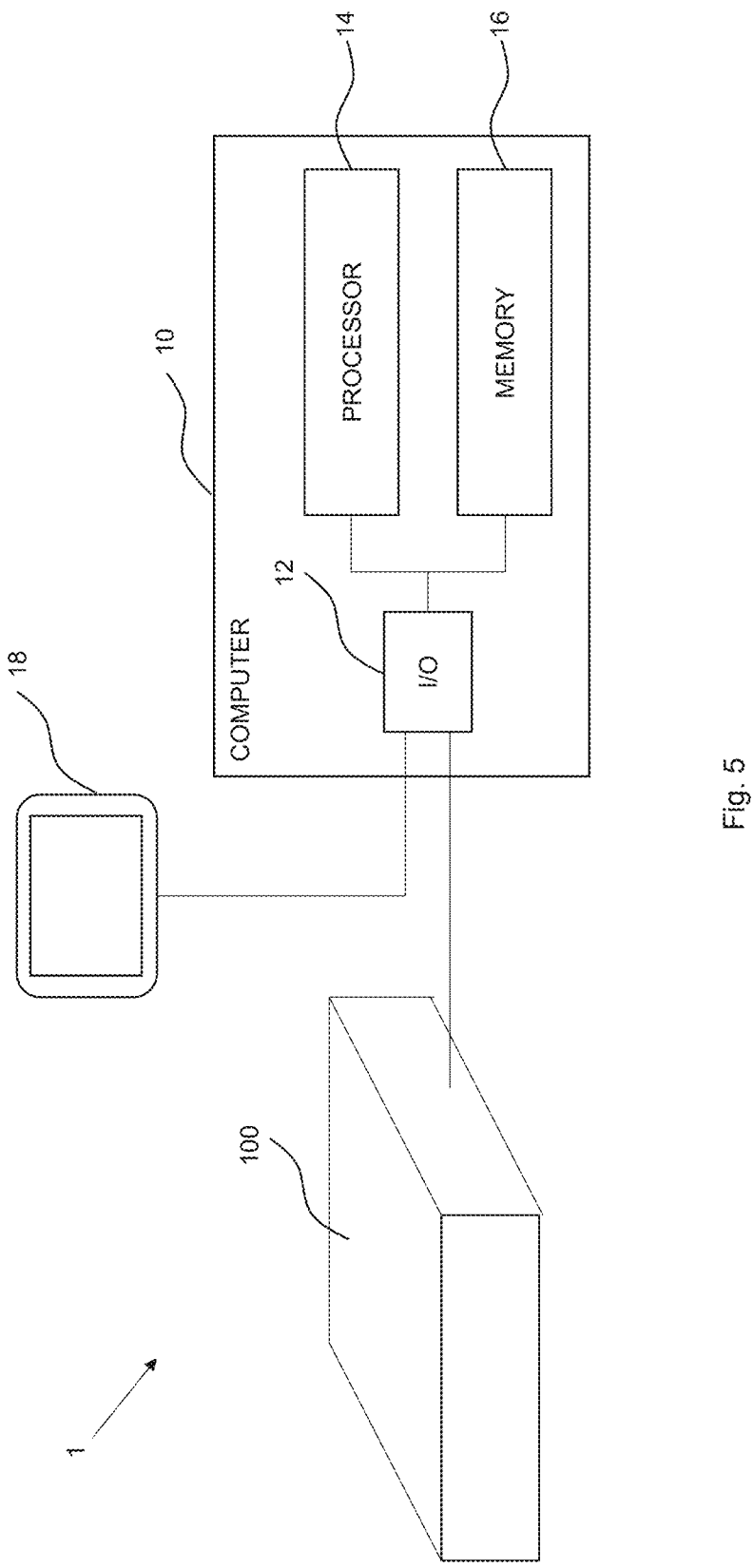
FIG. 5 is an illustration of a detector system according to an embodiment.

An aspect of the invention relates to a detector system 1 for molecular imaging of a radionuclide, see FIGS. 1 and 5. The detector system 1 comprises a 3D semiconductor detector 100 comprising a plurality of sensor stacks 110. Each sensor stack 110 of the plurality of sensor stacks 110 comprises a plurality of semiconductor sensors 120 each comprising a plurality of pixels 125 as shown in FIGS. 3 and 4. The plurality of semiconductor sensors 120 is made of a semiconductor material having an average atomic number Z below 40.

The detector system 1 also comprises a read-out circuitry connected to the pixels 125 in the 3D semiconductor detector 100 and configured to a pixel value from a pixel in a semiconductor sensor 120 of the 3D semiconductor detector 100 if the pixel value exceeds a cutoff threshold and if the pixel 125 and at least one adjacent pixel in the semiconductor sensor 120 both detect an interaction within a defined time interval. Pixel values are presentative of a respective energy deposited at a pixel 125 by an interaction induced by an incident gamma ray in the 3D semiconductor detector 100.

The detector system 1 further comprises at least one processor 14 and at least one memory 16 comprising instructions, which when executed by the at least one processor 14, cause the at least one processor 14 to predict, based on the pixel values output by the read-out circuitry, the interactions in the 3D semiconductor detector 100 belonging to a same event induced by incident gamma ray. The at least one processor 14 is also caused to estimate, based on the predicted predictions in the 3D semiconductor detector 100 belonging to the same event, a direction of the incident gamma ray inducing the same event. The at least one processor 14 is further caused to reconstruct an image based on the estimated directions of incident gamma rays.

Figure 6:
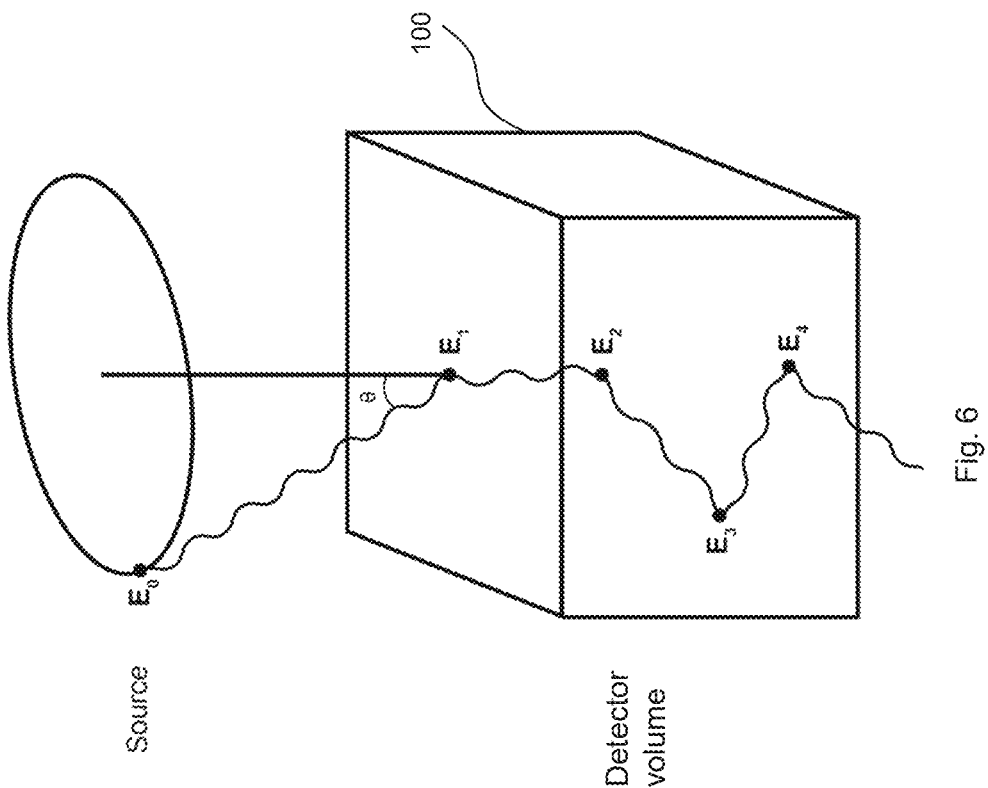
FIG. 6 schematically illustrates a typical geometry setup for imaging with the 3D semiconductor detector.

The 3D semiconductor detector 100 and the detector system 1 of the embodiments register all interactions, including Compton scatter interactions and absorption by photoelectric effect, taking place in the 3D semiconductor detector 100 upon incidence of gamma rays generated by the radionuclides. As schematically shown in FIG. 6, an incident gamma ray may induce a series of such interactions in the detector volume, represented by interactions $E_1$ to $E_4$ in the figure. The interactions in the 3D semiconductor detector 100 induced by a single incident gamma ray are denoted an event herein. Hence, an event comprises one or more such interactions within the detector volume, such as four interactions in FIG. 6. In the art, such an event of interactions induced by a single incident gamma ray is also referred to as a gamma ray track or a track or series of interactions.

In the art of molecular imaging, it is traditionally desired to merely have a single Compton scatter interaction per incident gamma ray followed by absorption by photoelectric effect. Such prior art detector systems, such as in the form of Compton cameras, have therefore been designed to include a scatter detector where the Compton scatter interaction takes place followed by an absorber detector where the scattered photon is absorbed through photoelectric effect. The scatter detector is typically 1-3 mm thick fabricated from a light material so the corresponding probability for an interaction is low. Hence, the design of the scatter detector in such Compton cameras imply that most gamma rays incident onto the scatter detector will not induce any interaction and will thereby not be detected by the Compton camera. Furthermore, since the Compton photon arising in the Compton scatter interaction in the scatter detector can scatter in any direction, only a few of such Compton photons will hit the absorber. Accordingly, the efficiency of such Compton cameras will thereby low, see Table 3.

The 3D semiconductor detector 100 and the detector system 1 of the embodiments have taken a radically different approach, which significantly improves the efficiency as compared to prior art Compton cameras, or indeed SPECT and PET systems. This is possible by registering all interactions taking place in a comparatively thick detector volume and then sorting the interactions into correct order of interactions per event induced by an incident gamma ray and also sorting the interactions belonging to different events induced by different incident gamma rays. Thus, whereas the prior art solutions have been designed to avoid having multiple Compton scatter interactions in the detector volume as any Compton scatter interaction following the initial Compton scatter interaction causes blurring in such prior art detector solutions, the embodiments make use of all such interactions to improve not only the efficiency but also the spatial resolution and the resolution in energy and time of the detector system 1.

The read-out circuitry of the detector system 1 therefore utilizes the fact that the noise is uncorrelated from pixel to pixel while a real Compton scatter interaction will almost always be detected by two or more adjacent pixels 125 in the 3D semiconductor detector 100. This means that, within a given time interval, typically in the ns range, it is highly unlikely that noise will cause a signal exceeding the cutoff threshold in at least two adjacent pixels 125 in a semiconductor sensor 120, whereas it is highly likely that a real Compton scatter interaction will cause signals exceeding the cutoff threshold in at least two adjacent pixels 125 in a semiconductor sensor 120. This can therefore be utilized by the read-out circuitry to suppress noise events for a given cutoff threshold or get the same number of noise counts for a lower cutoff threshold.

Hence, an advantage of the detector system 1 is that it can use low cutoff thresholds and still suppress noise, which reduces the power consumption by the detector system 1 as higher cutoff thresholds mean higher power consumption.

In an embodiment, the read-out circuitry is therefore configured to compare the pixel value with the cutoff threshold and output the pixel value of the pixel 125 if the pixel value exceeds the cutoff threshold and if the pixel 125 and the at least one adjacent pixel in the semiconductor sensor 120 both detect an interaction within the defined time interval.

In an embodiment, the read-out circuitry is configured to not output the pixel value if the pixel value exceeds the cutoff threshold if no adjacent pixel in the semiconductor sensor 120 detects an interaction within the defined time interval.

Hence, in this embodiment, the read-out circuitry is configured to output a pixel value of a pixel 125 if, and only if, i) the pixel value exceeds the cutoff threshold and ii) the pixel 125 and at one adjacent pixel in the same semiconductor sensor 120 both detect an interaction within the defined time interval. Thus, if no adjacent pixel in the semiconductor sensor 120 also detect an interaction within the defined time interval as the current pixel 125 then the read-out circuitry will, in this embodiment, not output the pixel value even if exceeding the cutoff threshold value.

In this particular embodiment, there could be two different situations:

1) pixel value≤cutoff threshold→no pixel value output; or
2) pixel value>cutoff threshold→pixel value output only if at least one adjacent pixel detects an interaction within the defined time interval In another embodiment, an interaction detected in a single pixel 125 but in no adjacent pixels in a semiconductor sensor 120 could still qualify as a real signal and not noise if the pixel value is significantly higher than the cutoff threshold. Such a situation could occur if the interaction takes place very close to the charge collecting electrode, see FIG. 16. In this embodiment, two thresholds are thereby used by the read-out circuitry, the cutoff threshold and a larger read-out threshold. In such an embodiment, the read-out circuitry is configured to not output the pixel value if the pixel value exceeds the cutoff threshold but is below the read-out threshold if no adjacent pixel in the semiconductor sensor 120 detects an interaction within the defined time interval. Further, in this embodiment, the read-out circuitry is configured to output the pixel value if the pixel value exceeds the read-out threshold even if no adjacent pixel in the semiconductor sensor 120 detects an interaction within the defined time interval.

In this particular embodiment, there could be three different situations:

1) pixel value≤cutoff threshold→no pixel value output;

2) cutoff threshold<pixel value≤read-out threshold→pixel value output only if at least one adjacent pixel detects an interaction within the defined time interval; or 3) pixel value>read-out threshold→pixel value output In an embodiment, the read-out circuitry comprises a sample and hold circuitry configured to temporarily store pixels values. In such an embodiment, the read-out circuitry is configured to flag pixel values stored in the sample and hold circuitry for output if the pixel values exceeds the cutoff threshold value and if the pixel 125 and at least one adjacent pixel in the semiconductor sensor 120 detect an interaction within the defined time interval.

Thus, in this embodiment, pixel values are not necessarily output by the read-out circuitry as soon as a pixel 125 detects an interaction. Rather the pixel values, typically analogue pixel values, are temporarily stored or held by the sample and hold circuitry for output at a later, selected time instance. In such a case, the read-out circuitry preferably flags those pixel values that should be output, i.e., those pixel values meeting the above-mentioned criteria. Hence, at the time of output from the sample and hold circuitry only those pixel values that are flagged for output will be output by the read-out circuitry.

This embodiment has the advantage of scheduling pixel value output at selected time instances rather than as soon as a pixel value is generated by an interaction in the semiconductor sensor 120. For instance, pixel values could be output sequentially.

The sample and hold circuitry could be separate circuitry connected to the pixels 125 or forming part of the pixels 125. In the latter case, the sample and hold circuitry is therefore configured to temporarily hold the pixel values, typically in the form of an analogue charge value, at the respective pixels.

In an embodiment, the read-out circuitry is configured to assign a time of arrival (TOA), also referred to as time of interaction (TOI) herein, to the pixel value if the pixel value is output by the read-out circuitry.

Thus, in this embodiment, time stamps or other time information representing the TOA or TOI are only assigned to pixel values if they are output by the read-out circuitry. Thus, those pixel values that are below the cutoff threshold or not output due to no interaction detection at adjacent pixel(s) need not to be assigned any TOA or TOI.

In an embodiment, the detector system 1 further comprises at least one TOA circuitry configured to assign the time of arrival to the pixel values. The at least one TOA circuitry could be in the form of, comprising or connected to a clock circuitry.

Another way of saving power for the detector system 1 is to have several pixels 125 sharing circuitry within a semiconductor sensor 120. For instance, a plurality of pixels 125 in a semiconductor sensor 120 could share a same TOA circuitry, also referred to as TOA clock herein. In such an embodiment, the detector system 1 comprises at least one TOA circuitry per semiconductor sensor 120. Each such clock circuitry of the at least one TOA circuitry is then shared by a respective set of multiple pixels in the semiconductor sensor 120 and is configured to assign the time of arrival to pixel values of pixels 125 belonging to the respective set of multiple pixels 125.

For instance, all pixels 125 within a semiconductor sensor 120 could share the same TOA circuitry. In such a case, each semiconductor sensor 120 then comprises a respective TOA circuitry for all pixels 125 within the semiconductor sensor 120. In another example, a semiconductor sensor 120 could comprise multiple TOA circuitries, such as N≥2 TOA circuitries. In such an example, the pixels 125 in the semiconductor sensor 120 are divided into N sets of multiple pixels 125 and the pixels 125 in such a set of multiple pixels 125 share the same TOA circuitry. In fact, it is possible for thousands of pixels 125, tens of thousands of pixels 125, or even hundreds of thousands of pixels or million of pixels in the same semiconductor sensor 120 to share the TOA circuitry.

Figure 22:
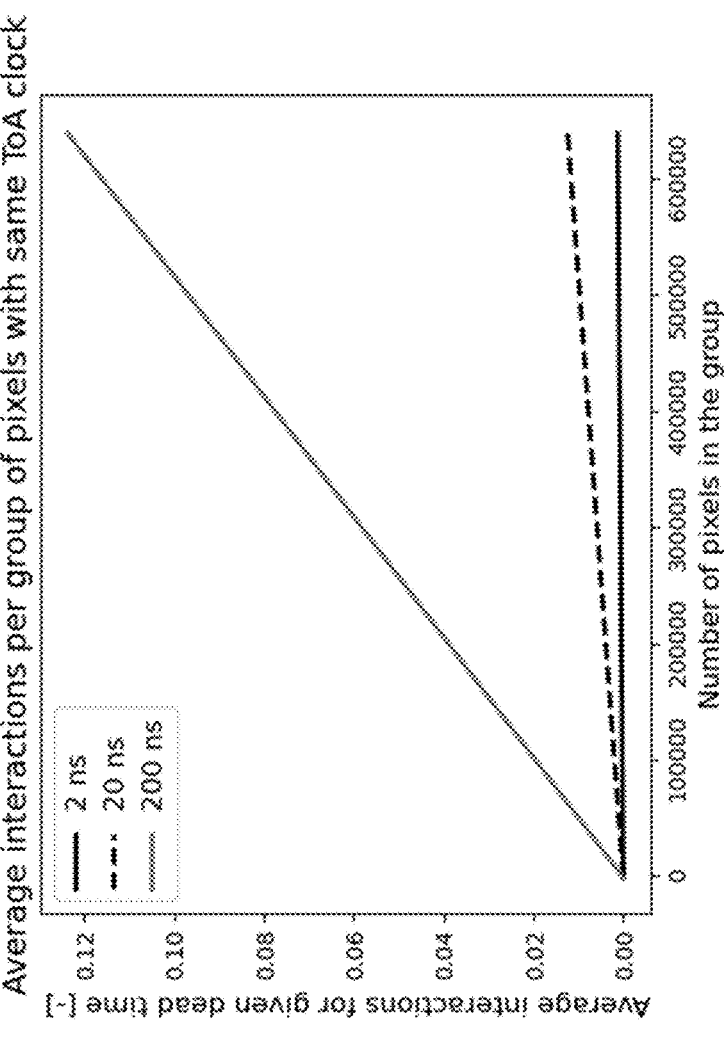
FIG. 22 illustrates average interactions per group of pixels with the same TOA circuitry, assuming a 511 keV monochromatic source and 500 MBq activity.

FIG. 22 is a graph illustrating average number of interactions per group of pixels 125 sharing the same ToA circuitry or clock. As is shown in the figure, it is possible to have several hundreds of thousands of pixels 125 for a single ToA circuitry for the tested dead time intervals (2 ns, 20 ns, 200 ns).

Figure 16:
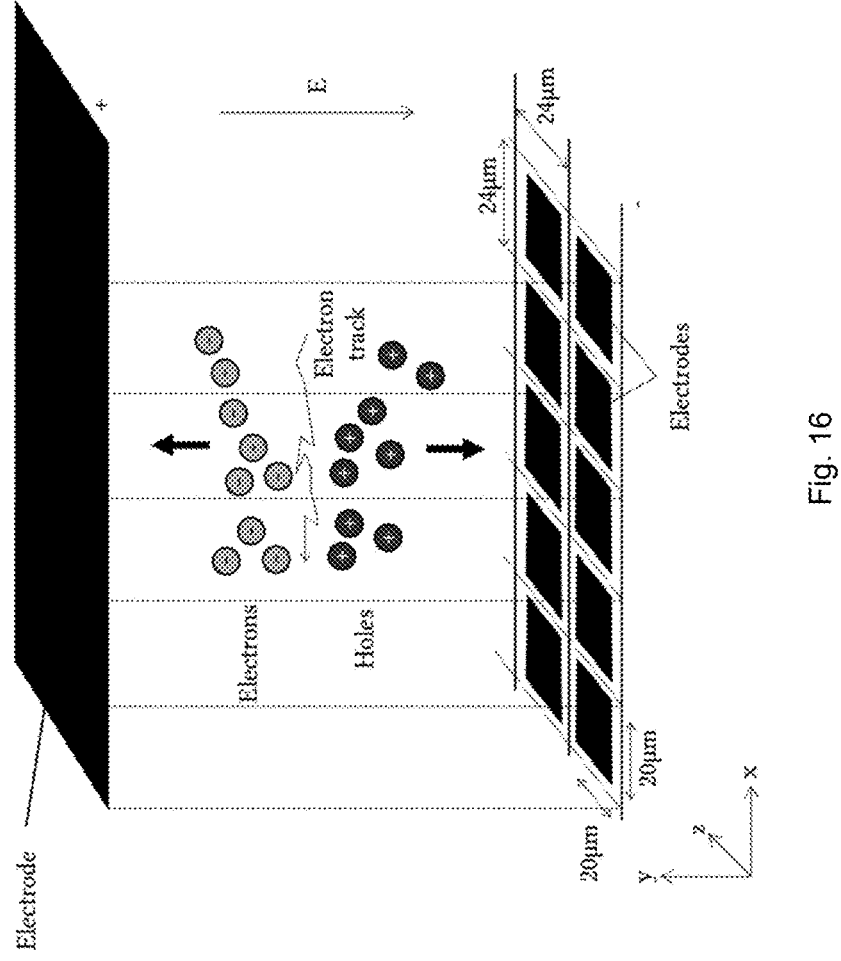
FIG. 16 is a schematic visualization of the detector geometry.

The pixel values generated at pixels 125 by an incident gamma ray are typically analog values, such as in the form of a charge collected by the charge collecting electrode of the pixel 125, see FIG. 16. As mentioned in the foregoing, such analog values or signals could be locally stored by the sample and hold circuitry prior to output. The analog values are preferably digitized into digital pixel values by at least one analog-to-digital converter (ADC). Hence, in an embodiment, the detector system 1 comprises at least one ADC configured to digitize pixel values output by the read-out circuitry.

As described above, power saving for the detector system 1 could be achieved by sharing circuitry between pixels 125 in the semiconductor sensors 120. This can be exploited by having a set of multiple pixels 125 in a semiconductor sensor 120 sharing a same ADC. In such an embodiment, the detector system 1 comprises a plurality of ADCs per semiconductor sensor 120. Each such ADC of the plurality of ADCs is shared by a respective set of multiple pixels 125 in the semiconductor sensor 120 and is configured to digitize pixel values of pixels 125 belonging to the respective set of multiple pixels 125.

The digitization of analog pixel values is advantageously coordinated by usage of the previously mentioned sample and hold circuitry as then flagged analog pixel values could be output to the ADCs for digitization into digital pixel values when the respective ADCs are available for use.

The set of pixels 125 sharing an ADC could the same set of pixels 125 sharing a clock circuitry or another set of pixels 125. The above-mentioned illustrative examples of the number of pixels 125 in a set sharing a clock circuitry also applies to the number of pixels 125 in a set sharing an ADC.

The particular value of the cutoff threshold could be determined based on, among others, the particular design of the 3D semiconductor detector 100, power consumption requirements and detector efficiency requirements.

Figure 19:
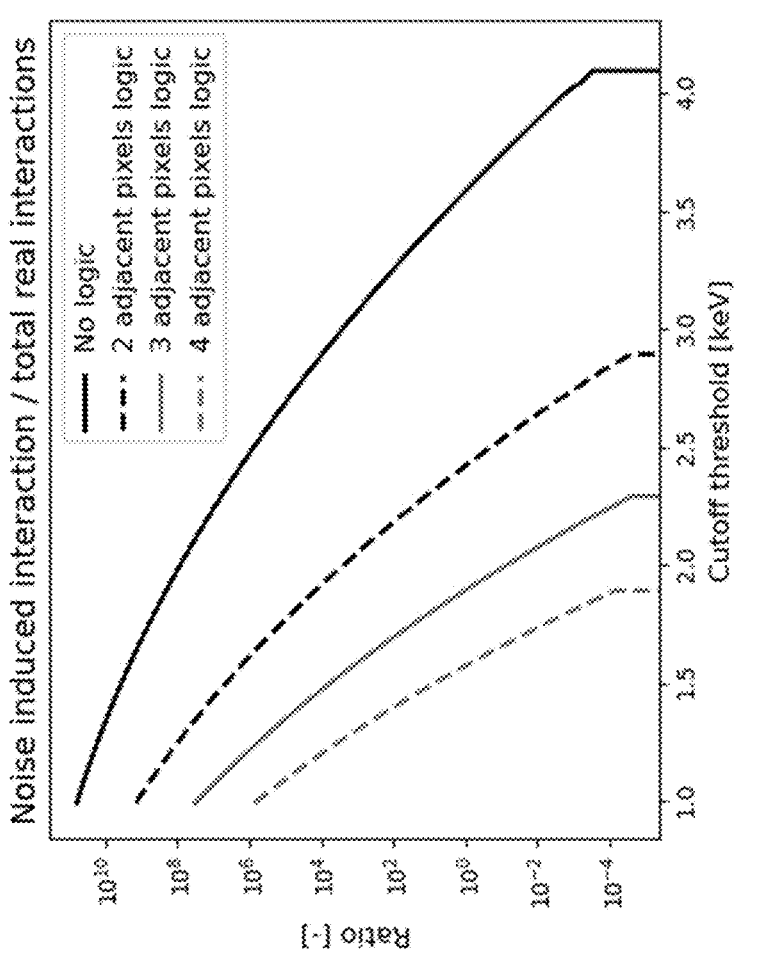
FIG. 19 illustrates the ratio between noise-induced interactions, occurrences in which the noise level is above a cutoff threshold and therefore regarded as a true interaction, and the total number of real interactions, assuming a 511 keV monochromatic source and 5 MBq activity.

FIG. 19 is a simulation of the ratio between noise-induced interactions, i.e., occurrences in which the noise level is above the cutoff threshold and therefore regarded as a true interaction by the 3D semiconductor detector 100, and the total number of real interactions. Four different cases are reported in the figure, according to different logic used. In the first case, the read-out circuitry does not use any logic for read-out selection, therefore as soon as the noise level is beyond the cutoff threshold the read-out circuitry considers it as interaction. In the other cases, in order for the pixel value or signal to be counted as interaction, at least a certain number of adjacent pixels 125 need to activate in the same time stamp. This is something that basically always occur in photon interactions with the 3D semiconductor detector 100, but since the random noise is uncorrelated it will be less likely to have adjacent pixels 125 activated by just noise the more pixels we add to the adjacent logic constrain. The cutoff thresholds tested ranged from 1 keV to 4.15 keV. This range was chosen to start from twice the value of the standard deviation (σ) of the noise distribution, and to end to a cutoff threshold value that would lead to correctly rejecting all noise induced interaction without employing the adjacent pixel logic.

For instance, as shown in FIG. 19, accepting a ratio between noise-induced interactions and total real interactions of $10^{-2}$ would allow a reduction of the cutoff threshold from close to 4 keV down to about 2.7 keV or less by the present invention.

Figure 20:
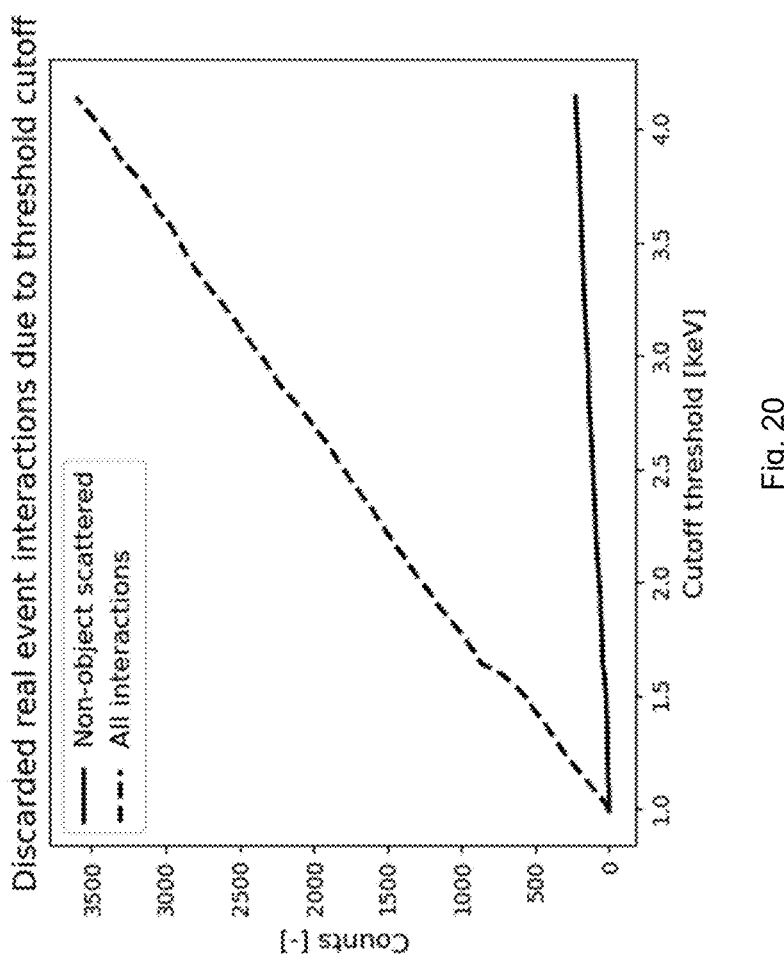
FIG. 20 illustrates the number of photon interactions that would be discarded given a certain cutoff threshold, assuming a 511 keV monochromatic source and 5 MBq activity. The dashed line reports the number of interactions lost from all incoming photons including both interactions generated from object scattered photons and non-object scattered ones. The solid line represents the number of interactions discarded that arises from non-object scattered photons.

FIG. 20 illustrates the number of photon interactions that would be discarded given a certain cutoff threshold. This happens when the deposited energy is smaller than the cutoff threshold set to cut off the noise, and it ends up being discarded. The dashed line reports the number of interactions lost from all incoming photons, therefore including both interactions generated from object scattered photons (which are regarded as background that one would like to discard) and non-object scattered ones. The solid line represents the number of interactions discarded that arises from non-object scattered photons, which are the ones that should be used to reconstruct the image, and its maximum value is of 228 for the highest energy threshold set.

In an embodiment, the cutoff threshold value used by the read-out circuitry could be set in an interval of from 1 keV up to 10 keV, preferably selected within an interval of from 1 keV up to 5 keV, and more preferably selected within an interval of from 1 keV up to 3 keV. The actual value of the cutoff threshold value could be determined at least partly based on the acceptable ratio shown in FIG. 19 and the signal-to-noise ratio.

In an embodiment, the cutoff threshold value is set to be equal to kσ, wherein σ represents standard deviation of the noise distribution, preferably of Gaussian noise, and k is a positive number larger than one. In an embodiment, k is preferably equal to or larger than 1.5, and more preferably equal to or larger than 2. In a particular embodiment, k is smaller than 4.

The particular value of the defined time interval could be determined based on, among others, the particular design of the 3D semiconductor detector 100, power consumption requirements and detector efficiency requirements.

In an embodiment, the defined time interval is dependent on the particular time resolution of the at least one clock circuitry in the detector system 1. Illustrative, but non-limiting, examples of such a defined time interval is equal to or below 500 ns, preferably equal to or below 250 ns, more preferably equal to or below 100 ns, and most preferably equal to or below 75 ns, such as equal to or below 50 ns, or even lower, such as equal to or below 25 ns, equal to or below 10 ns, equal to or lower than 7.5 ns, equal to or lower than 5 ns or equal to or below 2.5 ns. In fact, even shorter time intervals could be used, such as in the ps range, i.e., from about 1 ps up to about 1 ns, or from 10 ps up to about 1 n or from 100 ps up to 1 ns.

In an embodiment, an energy of the interaction in the 3D semiconductor detector 100 as used herein means an energy deposited during or at the interaction in the 3D semiconductor detector 100.

In an embodiment, the at least one processor 14 is configured to reconstruct an image representative of a distribution of the radionucleotide within an object, preferably an animal subject, and more preferably a human subject.

In an embodiment, the semiconductor material of the 3D semiconductor detector 100 is produced in so-called wafers 130, see FIG. 1, such as 8-inch diameter wafers 130, that are processed to contain, for instance, about 70 semiconductor sensors 120 with an individual area (H×W) of, for instance 20 mm×20 mm. The wafer 130 may be diced using, for instance, deep reactive ion etching, which gives a well-defined edge, meaning dead area can be kept to a minimum. The different semiconductor sensors 120 will be built into modules, also referred to as sensor stacks or tiles 110 herein. In such a case, each sensor stack 110 can contain, for instance, around 40 semiconductor sensors 110 with their own power supply and data read-out circuitry. The semiconductor sensors 120 may be attached to each other with a thin layer of glue as part of an automated assembly process. For instance, if the wafers 130 have a thickness of about 0.5 mm, each sensor stack 110 could be in the form of a cube with height (H), width (W) and depth (D) of about 20 mm as an illustrative, but non-limiting, example.

In an embodiment, each sensor stack 110 in the 3D semiconductor detector 100 is preferably in the form of a hexahedron and in particular a rectangular cuboid, and more preferably a cube.

In an embodiment, the plurality of semiconductor sensors 120 in a sensor stack 110 is attached to each other by gluing.

For connection to the semiconductor sensors 120, flexible printed circuit boards may be used to route power and data. Such printed circuit boards will constitute a "dead volume". In a preferred embodiment, such printed circuit boards are only attached to the edge of the semiconductor sensors 120 and can be made very thin, and thus, will have negligible impact on the performance. In general, material (except for semiconductor material) close to the 3D semiconductor detector 100 or in the 3D semiconductor detector 100 should be minimized to avoid background from scattered gamma rays. A mechanical structure will keep together the semiconductor stacks 110 together to form the 3D semiconductor detector 100 as shown in FIG. 1. Such a mechanical structure can also provide further attachments to power supplies, control systems and data storage. As an illustrative, but non-limiting, example hundred semiconductor stacks 110 could be arranged to form a 3D semiconductor detector 100 having a depth of ten semiconductor stacks 110, such as about 200 mm, a width of ten semiconductor stacks 110, such as about 200 mm, and a height (H) corresponding to the height of a semiconductor stack 110, such as about 20 mm.

The 3D semiconductor detector 100 could be arranged on a gantry for rotation around a patient to be imaged. Alternatively, the 3D semiconductor detector 100 could be designed in the form of a cylinder to detect gammy rays from all direction without the need for rotation.

The building blocks of the 3D semiconductor detector 100 are, thus, the semiconductor sensors 120, also referred to as semiconductor chips herein, made from a semiconductor material, such as crystalline silicon, preferably with integrated complementary metal-oxide-semiconductor (CMOS)

electronics, for instance each about 0.5 mm thick and with an area of, for instance, 20×20 mm². In a preferred embodiment, the semiconductor sensors 120 contain both the sensor and analogue and digital electronics (CMOS electronics) required for signal amplification and processing for all pixels 125 within the semiconductor sensors 120. Using such semiconductor sensors 120 as building blocks, a significant detector volume can be achieved from semiconductor wafers 130 as indicated in FIG. 1. For instance, a detector volume equivalent of about 1,500 cm³ could be achieved using one hundred 8-inch semiconductor wafers 130 as starting material for the 3D semiconductor detector 100. However, much larger detector volumes could be obtained by using more such semiconductor wafers 130.

There are two main embodiments of semiconductor sensors 120 that could be used in the 3D semiconductor detector 100, a hybrid sensor or a monolithic sensor.

In a hybrid sensor, the CMOS electronics are separated from the semiconductor sensor 120. In an embodiment, the semiconductor sensor 120 could be 300-700 μm thick to build up the detector volume. The semiconductor sensor 120 preferably has high resistivity to achieve full depletion and charge collection with a reasonable bias voltage of a few hundred volts. This solution has the advantage of separating the CMOS, meaning you are free to choose a process node of, for example, 65 nm, which is the choice for RD53 application-specific integrated circuit (ASIC) planned for the upcoming CERN upgrade. In this solution, the ASIC is preferably bump bonded to the sensor chip with, for instance, 50 μm pitch and the target thickness for the CMOS ASIC is, for instance, 100 μm. It is, though preferred to thin down the CMOS wafer down to of the order of 10 μm to reduce the dead volume where gamma ray interactions would be missed. An example of a hybrid sensor is shown in FIG. 4, in which the ASICs 124 are flip chipped at the side of the semiconductor sensor 120 containing the pixels 125. For instance, each pixel 125 has a trace connecting it to a unique ASIC input channel and every input channel has its own charge integrating pre-amplifier, pulse processing and comparators for digitization.

Cartier et al., 2016 discloses a charge-integrating hybrid pixel detector for high-resolution imaging.

Figure 2:
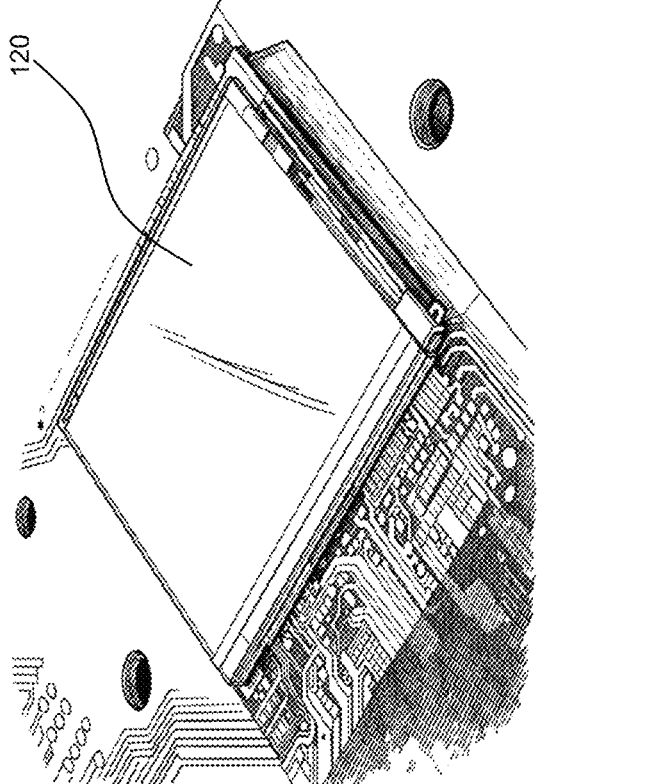
FIG. 2 is an illustration of a monolithic semiconductor sensor according to an embodiment.

A monolithic sensor integrates the CMOS electronics into the semiconductor sensor 120 itself and creates one single monolithic piece of semiconductor material. This has advantages in being simpler and cheaper since the advanced processes for bonding the CMOS to the semiconductor sensor 120 are not required. FIG. 2 illustrates an embodiment of a monolithic silicon sensor designed for the ATLAS experiment at CERN having a size of 20×21 mm with pixels dimensions of 150×50 μm (Peric et al., 2021). Such a monolithic silicon sensor could be used as semiconductor sensor 120 with integrated CMOS electronics for the 3D semiconductor detector 100. However, whereas the ATLAS experiment at CERN requires a count rate per pixel 125 or about 75×10³ kHz, the 3D semiconductor detector 100 of the embodiments can use a much lower count rate per pixel 125, such as about 1×10⁻³ Hz, implying that the power consumption can be reduced at the same performance. Also, readout strategy will be different since for any time stamp only around ten pixels 125 in a million will be hit during use of the detector system 1. This means that digital functionality does not need to be at the pixel level but a sample and hold structure can be used, where analogue charge is stored and flagged to be read-out and a digitizer can be shared between many pixels 125. The electron-hole pairs created by the Compton recoil electrons will diffuse over several pixels

125, and the resulting distribution of induced charge can be fitted with e.g., a Gaussian distribution. The position of the maximum value will give a sub-pixel spatial resolution (Sundberg et al., 2021) in the plane of the charge collecting electrodes, i.e., pixels 125, down to 1 μm spatial resolution. In the remaining dimension, along the wafer thickness of the semiconductor sensor 120, the width of the distribution can be used to estimate the depth of interaction. For instance, for a 500 μm thick semiconductor sensor 120, a resolution of <100 μm can be achieved. The amount of diffusion can be controlled with the bias of the semiconductor sensor 120. Lower bias will imply a wider charge distribution since the drift time will be longer. As shown in FIG. 3, individual semiconductor sensors 120 can be tiled or stacked together in modules, i.e., sensor stacks 110, to build up the volume of the full 3D semiconductor detector 100 as indicated in FIG. 3. FIG. 3 also indicates power and data connections 115 for the sensor stacks 110.

Corradino et al., 2021; Corradino et al., 2022; Corradino et al., 2023; Corradino et al., 2024; De Cilladi et al., 2021; Neubüser et al., 2021; Neubüser et al., 2022; Neubüser et al., 2023a; Neubüser et al., 2023b; and Pancheri et al., 2023 provide information of implementation of monolithic semiconductor sensors 120 that could be used according to the embodiments.

Hence, one way to construct the 3D semiconductor detector 100 is to use monolithic semiconductor sensors 120 as building blocks. Integrating the electronics into the semiconductor sensor 120 means that components that are separate today (integrated circuit and sensor) will be merged into one. This implies several practical advantages, including avoiding the need for advanced interconnection techniques. It also means that the power per pixel 125 can be reduced, which is very advantageous since the total number of pixels 125 will be very large for the 3D semiconductor detector 100. For instance, considering about 5,500 pixels 125 per monolithic semiconductor sensor 120 and assuming about 3,750 monolithic semiconductor sensors 120 in the 3D semiconductor detector 100, there will in total be around 20 million pixels 125 for the 3D semiconductor detector 100.

In an embodiment, the plurality of semiconductor sensors 120 comprises CMOS electronics comprising an ASIC 124 comprising analogue to digital converters (ADCs) and the read-out circuitry.

In a particular embodiment, each semiconductor sensor 120 of the plurality of semiconductor sensors 120 is a monolithic semiconductor sensor 120 integrating the CMOS electronics and the plurality of pixels 125 on the monolithic semiconductor sensor 120.

In another particular embodiment, each semiconductor sensor 120 of the plurality of semiconductor sensors 120 is a hybrid semiconductor sensor 120 comprising the CMOS electronics flip chipped at a side of the plurality of pixels 125 in the semiconductor sensor 120.

In an embodiment, the semiconductor sensors 120 have a cross section for Compton scattering of more than 40% at 140 keV.

The plurality of semiconductor sensors 120 is made of a semiconductor material having an average atomic number Z below 40. The semiconductor material could be a semiconductor material of a single chemical element, i.e., a so-called elemental semiconductor, or a semiconductor material of at least two chemical elements, i.e., a so-called compound semiconductor.

Examples of elemental semiconductors having an atomic number Z below 40 include group IV elemental semiconductors, such as silicon (Si) and germanium (Ge), and group VI elemental semiconductors, such as selenium (Se). An example of a compound semiconductor is gallium arsenide (GaAs).

In a preferred embodiment, the plurality of semiconductor sensors 120 is made of a semiconductor material having an average atomic number Z below 35.

In a preferred embodiment, the semiconductor material is selected from the group consisting of Ge, GaAs, Se and Si.

In a currently preferred embodiment, the semiconductor material is Si. In such an embodiment, the 3D semiconductor detector 120 is a 3D silicon detector 120 and each sensor stack 110 of the plurality of sensor stacks 110 comprises a plurality of silicon sensors 120 each comprising a plurality of pixels 125.

Table 1 below discloses specifications for silicon sensors 120 in an embodiment of the 3D semiconductor detector 100 with a total power consumption for the detector system 1 between 150 W and 750 W.

TABLE 1

| specification for silicon sensor | |
|---|---|
| Parameter | Specification |
| RMS noise | 360 eV |
| Power | 10-100 mW/cm$^2$ |
| Shaping time | <1-10 μs |
| Energy level | 256 |
| Sensor size | 20 × 20 mm$^2$ |
| Pixel size | 400-100,000 μm$^2$ |
| X, Y spatial resolution (RMS) | 1-100 μm |
| Z spatial resolution (RMS) | <300 μm |

The basic concept of the 3D semiconductor detector 100 of the detector system 1 is that each incident gamma ray will cause a cascade of interactions starting with an initial Compton scatter, and each of those interactions will be recorded with information of energy, time and position, such as in x, y, z coordinates, of the pixels 125 with signals from the Compton electron tracks induced by the Compton scatter interactions. From the distribution of the pixels 125 in the 3D semiconductor detector 100 that record interactions, the energy of the Compton recoil electron can be calculated by adding the pixel signals. In more detail, at each Compton scatter interaction the gamma ray (photon) transfers energy to a Compton recoil electron. The Compton recoil electron will travel a short path ("Compton electron track" or simply "electron track") before it has lost its kinetic energy. The Compton recoil electron will, during this path, excite electron-hole pairs in the semiconductor material of the 3D semiconductor detector 100, see FIG. 16. For instance, in the case of silicon as semiconductor material, it takes 3.6 eV to excite an electron-hole pair so for a Compton recoil electron with an energy of 20 keV over 5,500 electron-hole pars will be created along the electron track. The electron-hole pairs will be accelerated by the built in electric field in the semiconductor sensors 120 and induce a charge at the pixels (electrodes) 125, which charge is input to the front-end electrodes of the semiconductor sensors 120 as shown in FIG. 16. The summed or integrated charge at the pixels (electrodes) 125 is proportional to the energy of the Compton recoil electron.

The starting point of the Compton electron track can be determined, for instance by using the so-called straggling, meaning there is more energy loss at the end of the Compton electron track as compared to the start of the Compton electron track, or the center of a charge cloud. The momentum of the Compton recoil electron can be deduced from the beginning of the Compton electron track, for example with a linear fit. The energy of the incident gamma ray is known since it is determined by the particular radionuclide used. A primary gamma ray can go straight through the 3D semiconductor detector 100 with no interactions recorded, and this will correspond to a loss in efficiency. However, for all relevant energies, a significant fraction of the incident gamma rays will interact one or more times before escaping the 3D semiconductor detector 100 or being absorbed in a photoelectric interaction.

The detector system 1 is configured to put the interactions belonging to a same event induced by a single incident gamma ray in the correct order of consecutive interactions and find the first interaction of the event to calculate the direction of the incoming gamma ray, i.e., the angle of incidence θ of the gamma ray, see FIG. 6. The most intuitive way to solve this problem would be to have time stamps precise enough to resolve the order of interactions. This method has been used in space experiments with large separation between sensors (Caputo, 2022) but is not practical for medical imaging. For example, separating two interactions with a distance of 1 cm would require a time resolution of 33 ps (1 cm/c, with c being the speed of light), which is difficult to achieve, and more importantly, would drive to an unrealistic power consumption for the required volume of the 3D semiconductor detector 100.

Rather, in an embodiment, kinematic constraints can be used to determine the correct order of interactions. Such kinematic constraints will not only facilitate in determining the correct order of the interactions per event but also reject object scatter background. In such an embodiment, time stamps for each interaction can be used together with kinematic constraints to map each interaction to the correct event.

Figure 9:
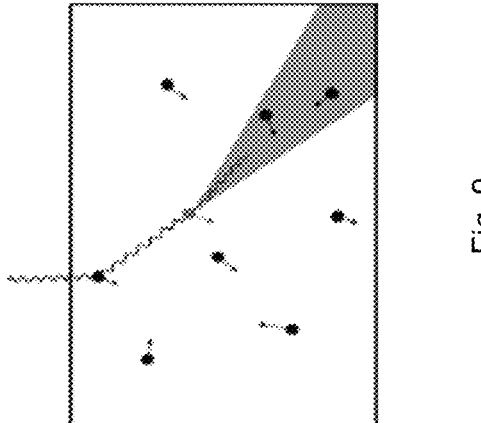
FIG. 9 illustrates the use of momentum of the Compton recoil electron to restrict, to a cone, the volume, in which to look for the next interaction within the chain of interactions generated in the same event.
Figure 8:
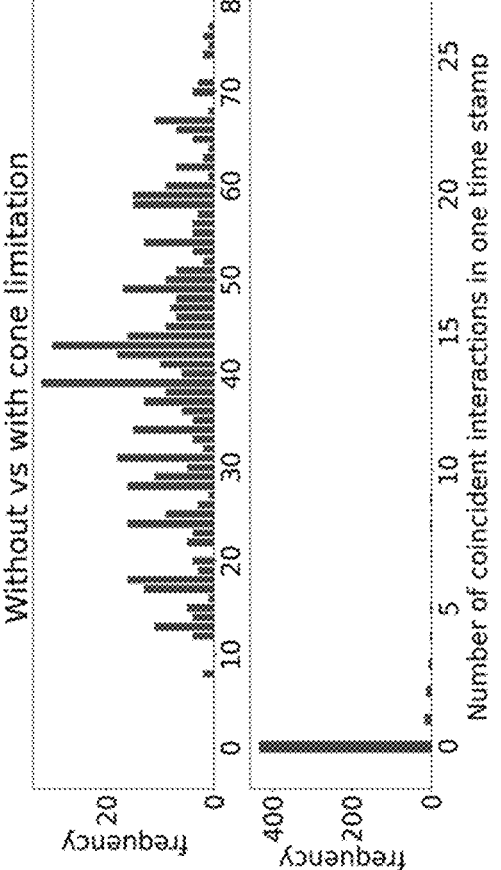
FIG. 8 illustrates the number of expected coincident interactions for an activity of 210 MBq for a time stamp resolution of 100 ns without momentum cone limitation (top) and with momentum cone limitation (bottom) from measured Compton recoil electron momentum.

The detector system 1 should make sure that interactions originating from different primary gamma rays are not mixed up but kept as separate events. FIG. 8 shows an example how many coincident interactions are detected for an activity of 210 MBq and time stamp resolution of 100 ns. The figure shows the number of expected coincident interactions without usage of a momentum cone limitation (top) and with a momentum cone limitation (bottom) from the measured Compton recoil electron momentum. Coincident interaction means an interaction requiring kinematic constraints to sort the interactions to the correct event. Hence, zero coincident interactions in one time stamp means that the time stamp resolution was enough to sort interactions into the correct event. If the momentum of the Compton recoil electron in the interaction is determined, this can constrain the volume ("momentum cone limitation"), in which to look for the next interaction as shown in FIG. 9. This volume will be determined by the opening angle of the constrained cone, which is proportional to the uncertainty of the Compton recoil electron momentum. Such an approach will mitigate the problem of mapping interactions with the same time stamp to the correct event as shown in the lower part of FIG. 8.

There are three major reasons to measure the electron track of the Compton recoil electron for momentum estimation. Firstly, increased accuracy of the interaction point. If the start of the Compton electron track cannot be determined, the estimated position of interaction will be less accurate. For lower energies this effect is not significant since the Compton electron track <10 μm. Secondly, less ambiguity in sorting interactions into the correct event and in the correct order. Thirdly, less ambiguity in image reconstruction since the Compton cone angle will be constrained to an arc. This also limits noise propagation.

Figure 10:
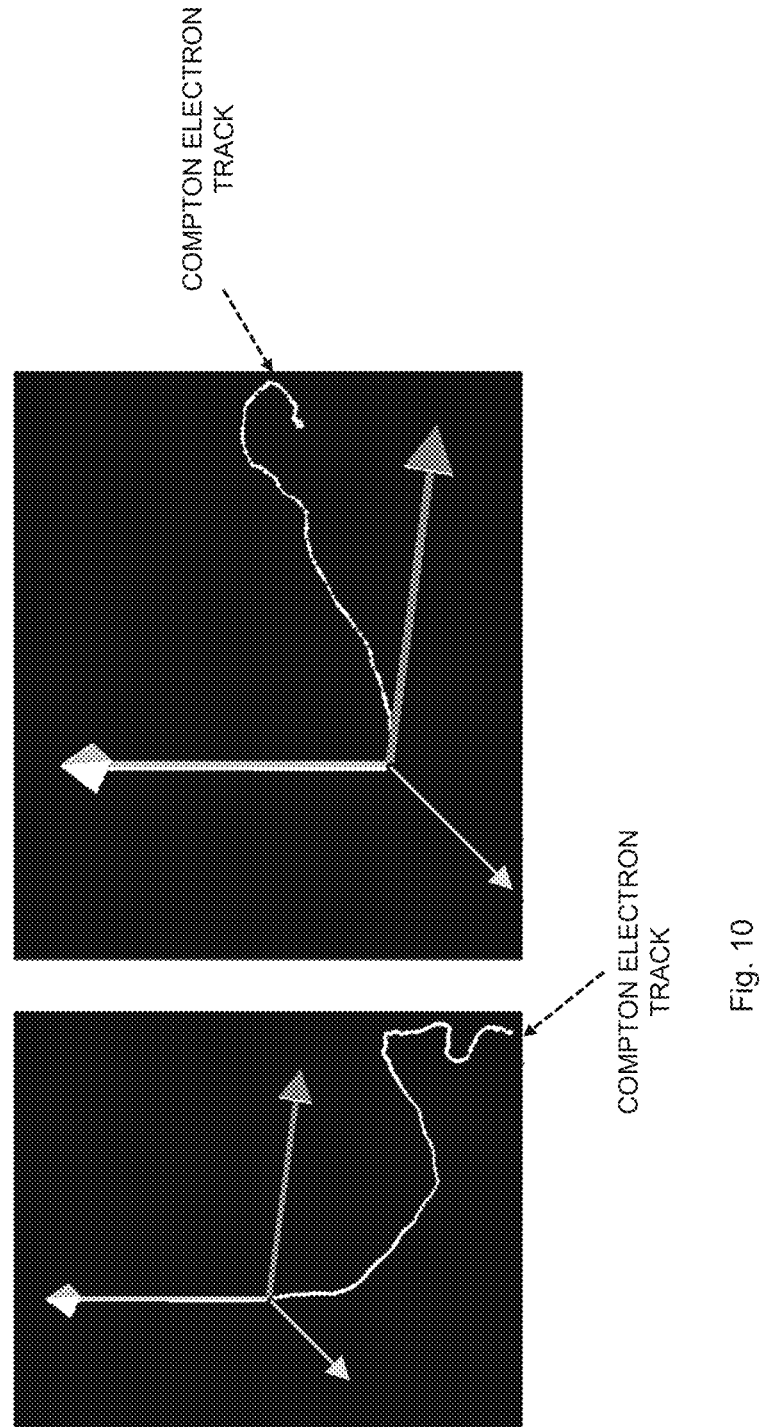
FIG. 10 illustrates Compton electron tracks simulated with GEANT4.
Figure 11:
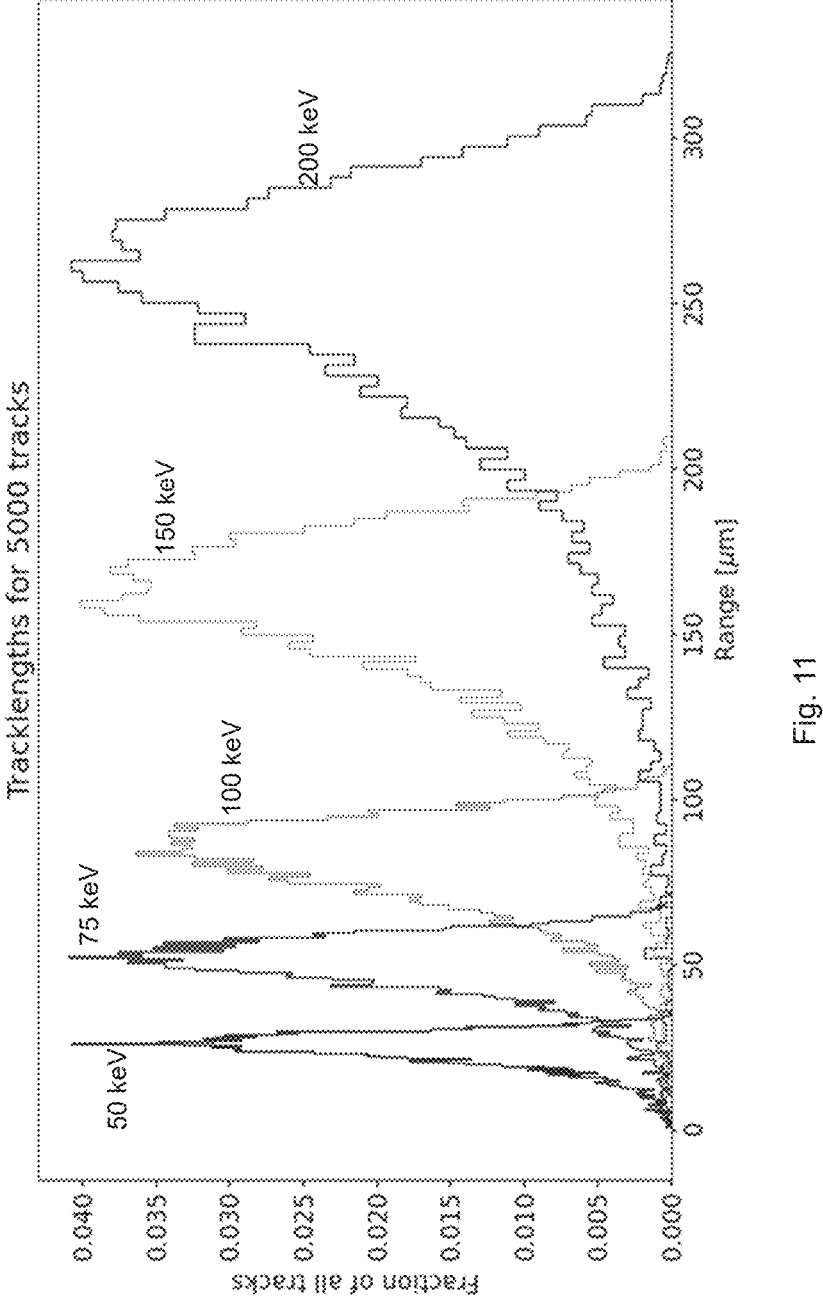
FIG. 11 illustrates the range of the electrons track length in silicon for energies from 50 keV to 200 keV.

FIG. 10 shows examples of Compton electron tracks for different energies (100 keV to the left and 40 keV to the right) simulated by GEANT4. As can be seen, the Compton electron tracks are not a straight line. A linear fit has been used to the first 10% of the Compton electron track to make sure that the electron momentum is estimated before significant electron scatter. The start versus the end of the Compton electron track can be determined by the straggling effect since more energy is deposited towards the end of the track. Accordingly, a higher charge will be deposited at pixel(s) 125 at the end of the electron track as compared to at the start of the electron track. FIG. 11 shows the range of the Compton recoil electrons for different energies ranging from almost zero to 350 µm.

In an embodiment, a pixel value is representative of an energy deposited at the pixel 125 by a Compton recoil electron along an electron track in the 3D semiconductor detector 100. The Compton recoil electron is created by a Compton scatter interaction induced by the incident gamma ray in the 3D semiconductor detector 100. In such an embodiment, the a least one memory 16 comprises instructions, which when executed by the at least one processor 14, cause the at least one processor 14 to predict a position of a start of the electron track based on a distribution of the energies deposited at each pixel 125 along the electron track in the 3D semiconductor detector 100.

For low electron energies it will not be possible to reconstruct the Compton electron track. Fortunately, for those events, since the Compton electron track is very short, the location of the interaction will still be accurate, such as in the form of the center of a charge cloud. However, very few pixels 125 will be hit in each time stamp in the 3D semiconductor detector 100 and most pixels 125 will not have to be read out.

A sample and hold strategy can be used where the analog charge is stored locally in the pixel 125 after amplification and each pixel 125 with a hit will be flagged and digitized in consecutive order. To further suppress noise and lower the minimum threshold for an interaction to be flagged, a condition can be added that at least two adjacent pixels 125 have fired, which will be true for real events but not for random noise.

For low energy Compton recoil electrons the position of the start of the electron track is predicted by identifying a center of a charge cloud in the 3D semiconductor detector 100. Generally, an incoming gamma ray undergoes Compton scattering in the 3D semiconductor detector 100 as indicated in FIG. 6. The Compton recoil electrons generated at such Compton interactions ($E_1$ to $E_4$ in FIG. 6) travel through the 3D semiconductor detector 100, depositing energy along their respective electron tracks. The energy is deposited as electron-hole pairs, see FIG. 16, forming a charge cloud. A bias voltage (E in FIG. 16) applied to the pixels causes charge transport of electrons and holes towards electrodes, where they are collected and measured. The charge cloud grows in size due to diffusion when moving towards the electrodes (pixels and common electrode). Due to the diffusion during charge transport together with the preferred small pixel size of the 3D semiconductor detector 100, charge-sharing between multiple pixels (electrodes) may occur in the scatter detection process. Such charge sharing can be exploited by the present invention in order to achieve sub-pixel resolution of the start position of the electron track.

In an embodiment, the at least one memory 16 comprises instructions, which when executed by the at least one processor 14, cause the at least one processor 14 to predict the position of the start of the electron track based on a center of a charge cloud in the 3D semiconductor detector 100 if an estimated energy of the Compton recoil electron is below a first threshold value.

For instance, for low energy Compton electrons, i.e., having an electron below the first threshold, the charge cloud could be estimated by a sphere. In such a case, the center of such a charge cloud corresponds to the start of the electron track.

A longer electron track can be expected for Compton recoil electrons with higher energies. For the relevant electron energies, the energy deposition increases as the electron velocity decreases according to the Bragg peak. Thus, the start of such an electron track can be discriminated from the end of the electron track by the straggling effect meaning that the Compton recoil electron deposits more energy at the end of the electron track as compared to the start of the electron track. Accordingly, the least amount of energy deposition is expected around the initial part of the track. This can be exploited for predicting the position of the start of the electron track for Compton recoil electrons with higher energies, i.e., an energy above a second threshold value.

In an embodiment, the at least one memory 16 comprises instructions, which when executed by the at least one processor 14, cause the at least one processor 14 to, if the estimated energy of the Compton recoil electron is above the second threshold value, perform linear regression to fit a line to the pixel values. The at least one processor 14 is, in this embodiment, also caused to compare a pixel value at a start of the line with a pixel value at an end of the line and predict the position of the start of the electron track as the one of the start of the line and the end of the line having a pixel value representing a lowest amount of energy deposited at the pixel.

As is schematically shown in FIG. 16, each semiconductor sensor 120 of the 3D semiconductor detector 100 preferably comprises a plurality of electrodes and at least one counter electrode. The semiconductor sensor 120 also comprises an electric field circuitry connected to the plurality of electrodes and the at least one counted electrode. The electric field circuitry is configured to apply a bias voltage (E in FIG. 16) between each electrode of the plurality of electrodes and a counter electrode of the at least one counter electrode.

The semiconductor sensor 120 comprises a plurality of pixels 125 and where each such pixel 125 comprises an electrode. For instance, a pixel 125 with a pixel size of 24 µm×24 µm could comprise an electrode of 20 µm×20 µm. The semiconductor sensor 120 also comprises one or more counter electrodes for the electrodes. In an embodiment, the semiconductor sensor 120 comprises a single counter electrode that is shared by all the electrodes in the semiconductor sensor 120. In another embodiment, the semiconductor sensor 120 comprises multiple counter electrodes. In such an embodiment, the bias voltage is applied between a first set of electrodes and a first counter electrode, between a second set of electrodes and a second counter electrode, and so on.

In a volume of silicon as illustrative example of semiconductor material, the percentage of different types of interactions caused by incident gamma rays is shown in Table 2. A large fraction of the incident gamma rays can be reconstructed and used for image reconstruction by the detector system 1. Since all interactions are detectable, there is no penalty in having a thick 3D semiconductor detector 100 with multiple Compton scatterings. Moreover, due to the solid block of the 3D semiconductor detector 100, the probability is higher for scattered gamma rays to interact a second time. Altogether, these lead to a significant efficiency gain for the 3D semiconductor detector 100 over both state-of-the-art collimator-based SPECT but also Compton camera prototypes. In fact, the detector system 1 of the embodiments can even outperform PET both in efficiency and spatial resolution.

TABLE 2

| GEANT4 simulation | | | | |
|---|---|---|---|---|
| Type of interaction | 140 keV | 511 keV | 700 keV | Comment |
| 1 Compton scatter and escape | 19% | 23% | 23% | Recoil electron momentum required to estimate direction of incident gamma ray, reduced spatial resolution since only one Compton interaction is detected |
| >1 Compton scatter and escape | 23% | 33% | 31% | Recoil electron momentum will constrain the event circle to a cone but is not required to estimate direction of incident gamma ray |
| ≥1 Compton scatter and photo absorption | 39% | 14% | 10% | Recoil electron momentum will constrain the event circle to a cone but is not required to estimate direction of incident gamma ray |
| 1 photo absorption | 5% | 0.2% | 0.1% | Direction of incident gamma ray cannot be determined |
| No scatter or photo absorption | 12% | 30% | 35% | Direction of incident gamma ray cannot be determined |

Table 2 illustrates GEANT4 simulation of three different energies of primary gamma rays (140, 511 and 700 keV) incident on 6 cm silicon at the center of a 20×20 cm$^2$ area.

In an embodiment, the event induced by the incident gamma ray comprises at least one Compton scatter interaction in the 3D semiconductor detector 100 followed by absorption by photoelectric effect in the 3D semiconductor detector 100 or escape. In a particular embodiment, the event induced by the incident gamma ray comprises multiple, i.e., at least two, Compton scatter interactions in the 3D semiconductor detector 100, see for instance FIG. 6, followed by absorption by photoelectric effect in the 3D semiconductor detector 100 or escape.

In an embodiment, the time information in the signals output by the read-out circuitry can be used to group interactions. In such an embodiment, the at least one memory 16 comprises instructions, which when executed by the at least one processor 14, cause the at least one processor 14 to group interactions having a respective time, represented by the time or interaction, within a defined time interval. The at least one processor 14 is, in this embodiment, also caused to predict, based on the pixel values output by the read-out circuitry, the interactions in the 3D semiconductor detector 100 belonging to the same event included by the gamma ray among the grouped interactions.

Thus, the time stamps or other time information of the interactions in the 3D semiconductor detector 100 can be used to group interactions having a respective time stamp or time within a defined time interval. For instance, the grouping could involve the interactions having a time falling within the time window or interval of from $t_1$ up to $t_2$, i.e., those interactions $E_k$ having a time $t_k$ among n interactions (k=1 . . . n) for which $t_k \in [t_1, t_2]$ or $t_1 \leq t_k \leq t_2$, wherein $t_1 < t_2$. Alternatively, the time interval could be defined as $t \pm \Delta t$, i.e., centered around some defined time point t.

In this embodiment, prediction of the interactions belonging to the same event induced by the incident gamma ray is limited to grouped interactions, i.e., to a subset of all detected interactions. This significantly simplifies the sorting of interactions into different events and further sorting the interactions within one event in correct order.

In an embodiment, the read-out circuitry is configured to generate position information for pixel values output by the read-out circuitry. Such position information then represents pixel coordinates of the pixel 125 in the semiconductor sensor 120.

Hence, in an embodiment, the read-out circuitry is configured to output, for each interaction induced by an incident gamma ray in the 3D semiconductor detector 100, a signal representative of a time, a position and an energy of the interaction in the 3D semiconductor detector 100 if the pixel value exceeds the cutoff threshold and if the pixel 125 and at least one adjacent pixel in the semiconductor sensor 120 both detect an interaction within the defined time interval.

As mentioned in the foregoing, the interactions in the 3D semiconductor detector 100 comprise at least one, typically multiple, Compton scatter interactions. In such a case, the read-out circuitry is preferably configured to output, for each Compton scatter interaction induced by the incident gamma ray in the 3D semiconductor detector 100, the signal representative of the time ("time of interaction"), the position of creation of a Compton recoil electron ("position information") and the energy of the Compton recoil electron induced by the Compton scatter interaction in the 3D semiconductor detector 100 ("pixel value representing an energy deposited at the pixel 125 by the Compton scatter interaction").

Thus, in this embodiment, at each Compton scatter interaction, the scattered gamma ray (photon) transfers part of its energy to a Compton recoil electron. The timing and position of such an energy transfer, i.e., creation of a Compton recoil electron, can then be detected as the time and position of the Compton scatter interaction in the 3D semiconductor detector 100. The position of such energy transfer or creation of the Compton recoil electron corresponds to the above-mentioned position of the start of the electron track.

Such a detection of the Compton recoil electron is possible since the Compton recoil electron will travel a short path, referred to as Compton electron track or simply electron track in the art, before losing its kinetic energy and will, during this path, excite electron-hole pairs, which can be detected at the pixels 125.

In an embodiment, the at least one memory 16 comprises instructions, which when executed by the at least one processor 14, cause the at least one processor 14 to sort the predicted interactions in the 3D semiconductor detector 100 belonging to the same event in an order of consecutive interactions based on the pixel values output by the read-out circuitry.

Preferably, the information of the time, position and energy of the interactions as represented by the signals output by the read-out circuitry is used to sort or order the interactions belonging to the same event in correct, i.e., consecutive, order starting from the first or initial interaction and ending with the last interaction in the 3D semiconductor detector 100 for the given event.

In an embodiment, the at least one memory 16 comprises instructions, which when executed by the at least one processor 14, cause the at least one processor 14 to predict an initial interaction of the same event induced by the incident gamma ray in the 3D semiconductor detector 100 based on the pixel values output by the read-out circuitry.

As mentioned above, the Compton recoil electron created in the Compton scatter interaction induces at least one electron-pair along an electron track in the 3D semiconductor detector 100. In such a case, the detector system 1 preferably comprises a charge circuitry configured to estimate the energy of the Compton recoil electron based on charges induced by the at least one electron-hole pair along the electron track.

In an embodiment, the charge circuitry is configured to estimate the energy of the Compton recoil electron by summing or integrating the charges detected by pixels 125 in the 3D semiconductor detector 100 along the electron track of the Compton recoil electron.

The estimated energies of Compton recoil electrons can be used to sort interactions and predict the interactions belonging to the same event induced by a given incident gamma ray. For instance, the estimated energies can be used to impose kinematic constraints to reject interactions unlikely to belong to the same event and/or be used in in maximum likelihood estimations to determine the direction of the incident gamma ray.

In an embodiment, the at least one memory 16 comprises instructions, which when executed by the at least one processor 14, cause the at least one processor 14 to predict, based on the pixel values output by the read-out circuitry, the interactions in the 3D semiconductor detector 100 belonging to the same event induced by the incident gamma ray in the 3D semiconductor detector 100 by imposing kinematic constraints on the Compton scattered gamma ray.

In a particular embodiment, the at least one memory 16 comprises instructions, which when executed by the at least one processor 14, cause the at least one processor 14 to estimate a momentum of a Compton recoil electron based on the pixel values output by the read-out circuitry. The at least one processor 14 is also caused to calculate a kinematic constraint for the Compton scatter interaction, i.e., on the Compton scattered gamma ray, based on the estimated momentum of the Compton recoil electron.

In an embodiment, the at least one memory 16 comprises instructions, which when executed by the at least one processor 14, cause the at least one processor 14 to estimate the momentum of the Compton recoil electron by a linear fit to a first part of the electron track in the 3D semiconductor detector 100.

For instance, a linear fit could be used to the first part of the electron track of the Compton recoil electron to facilitate estimation of the momentum of the Compton recoil electron before electron scatter along the electron track. This first part of the electron track could, for instance, correspond to a first predefined percentage of the electron track, such as first 25%, first 20%, first 15%, first 10% or first 5% of the electron track.

In an embodiment, the at least one memory 16 comprises instructions, which when executed by the at least one processor 14, cause the at least one processor 14 to calculate an opening angle of a constrained cone based on the estimated momentum of the Compton recoil electron. In such an embodiment, the constrained cone restricts the volume in the 3D semiconductor detector 100, within which a next interaction belonging to the same event induced by the incident gamma ray is allowed to take place.

FIG. 9 illustrates such an approach, in which a constrained cone has been added at the second Compton scatter interaction of an event. The constrained cone thereby limits the volume in the 3D semiconductor detector 100 so that a next interaction of the same event occurs within the limited volume. In this illustrative example, the number of potential interactions is, by usage of the constrained cone, reduced from eight interactions down to two interactions.

The opening angle of the constrained cone is dependent on the estimated momentum of the Compton recoil electron. In a particular embodiment, the opening angle of the constrained cone is proportional to an uncertainty of the estimated momentum of the Compton recoil electron.

In an embodiment, the at least one memory 16 comprises instructions, which when executed by the at least one processor 14, cause the at least one processor 14 to estimate, the direction of the incident gamma ray by a maximum likelihood estimation based on the pixel values output by the read-out circuitry.

Figure 7:
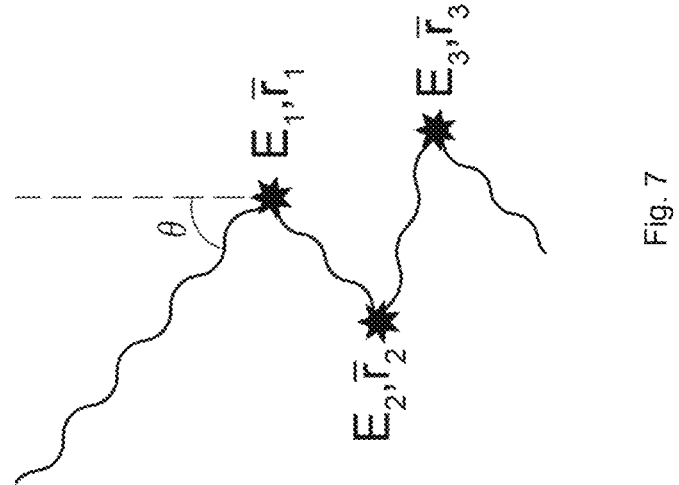
FIG. 7 schematically illustrated part of the process of image reconstruction for the detector system.

Thus, the incident direction of the gamma ray $\theta$ in FIGS. 6 and 7, also referred to as angle of incidence of the gamma ray, is estimated by a maximum likelihood estimation in this embodiment.

In a particular embodiment, the at least one memory 16 comprises instructions, which when executed by the at least one processor 14, cause the at least one processor 14 to estimate the direction of the incident gamma ray by maximizing $\mathcal{L}(\theta){=}P(E_1, \bar{r}_1|\theta_1, E_0){\times}P(E_2, \bar{r}_2|\theta_2, E_1, \bar{r}_1){\times}\ldots{\times}P(E_n, \bar{r}_n|\theta_n, E_{n-1}, \bar{r}_{n-1})$, wherein $E_k, \bar{r}_k, \theta_k$ represent energy, position and incident angle of interaction number k, k=1 . . . n and n represents a last interaction of the same event, and $E_0$ represents an energy of the incident gamma ray.

The energy of the incident gamma ray $E_0$ is known and is defined based on the particular radionuclides used. The energies $E_k$ can be determined as described in the foregoing for estimation of the energy of Compton recoil electrons based on integration of detected charges along the electron tracks or by deposited energy or charge in the case of absorption by photoelectric effect.

The uncertainty in the direction $\theta$ is $$\sigma_\theta \approx \sqrt{\frac{1}{I(\theta)}}, \text{ wherein } I(\theta) = -E\left[\frac{\partial^2}{\partial\theta^2}\ln\mathcal{L}(\theta)\right].$$

The embodiments of the invention are, however, not limited to the above presented examples of interaction sequence sorting methods but can also be used with other such methods including, but not limited to, a simple comparison method, a Compton edge test, a deterministic method, minimum square difference, a three Compton method, a physics based probabilistic method, a maximum likelihood method and neural networks.

A simple comparison method can be used for an event with two interactions. It is based on looking for the interaction that deposits more energy in the 3D semiconductor detector 100. Knowing the initial energy of the incident gamma ray, if such energy is above 400-500 keV, the incident gamma ray will more likely deposit more energy at the first interaction rather than the second interaction and vice versa if the initial energy is below such threshold (Lee et al., 2021).

A Compton edge test can be used for an event with two interactions or three or more interactions to discard possible permutations. It is based on the fact that there is a maximum energy that can be deposited via Compton interaction, so if one interaction deposits more energy than the threshold, it means that such an interaction is a photoabsorption and as such should be the last of the interaction for the event (Lee et al., 2021).

A deterministic method is mainly used for an event with two interactions and computes the probability for each sequence of interactions based on the Klein-Nishina formula and chooses the sequence of interactions with highest probability (Lee et al., 2021).

Minimum square difference can be used for events with at least three interactions. It is based on computing a figure of merit (FOM) based on redundant geometrical and energetic information on the same angle of scattering, and repeating such calculation 3 by 3 interactions summing all the FOM. The smallest FOM indicate the sequence of interactions that is most likely to be correct (Lee et al., 2021).

A three Compton method can be used for events with at least three interactions. It is based on the Klein-Nishina formula (Lee et al., 2021, Kroeger et al., 2002).

A physics based probabilistic method can be used for events with two or more interactions. This method keeps into account all the physical phenomena (Klein-Nishina formula, Lambert-Beer law, etc.) that a certain photon undergoes in order to generate a specific combination among the possible interactions for that event. For each permutation the total probability is calculated and the one with the highest probability is selected as correct one (Yoneda et al., 2023, Tashenov and Gerl).

A maximum likelihood method can be used for events with two or more interactions. It is somewhat based on the same physics as physics based probabilistic methods but it extends it further trying to estimate with more precision the incident angle of the gamma ray that maximizes the likelihood function (Sundberg et al., 2022).

Neural networks can be used to reconstruct the interaction sequence (Takashima et al., 2022).

In an embodiment, the at least one memory 16 comprises instructions, which when executed by the at least one processor 14, cause the at least one processor 14 to compare an estimated energy of a gamma ray with a reference energy defined based on the radionuclide and reject a gamma ray as being Compton scattered in an object to be imaged if the estimated energy differs from the reference energy with more than a minimum amount.

Hence, it is possible to reject any incident gamma rays that were Compton scattered in the imaged object, such as human body, since such incident gamma rays will have lower energy $E_0$ than the expected one that is defined based on the particular radionuclide used.

In an embodiment, the read-out circuitry is configured to output, for each interaction induced by an incident gamma ray in the 3D semiconductor detector 100, a signal representative of a time, a position and an energy of the interaction in the 3D semiconductor detector 100. The at least one memory comprises instructions, which when executed by the at least one processor 14, cause the at least one processor 14 to predict, based on the pixel output by the read-out circuitry, the interactions in the 3D semiconductor detector 100 belonging to a same event induced by the incident gamma ray. The at least one processor 14 is also caused to estimate, based on the predicted interactions in the 3D semiconductor detector 100 belonging to the same event, a direction of the incident gamma ray inducing the same event and reconstruct an image based on the estimated directions of incident gamma rays.

The image reconstruction is basically a two-step process where the first step estimates the primary interaction position and direction of incidence of the gamma rays, and the second step reconstructs an image from these events. The first of these steps includes separating background events from events induced by incident gamma rays originating from the radionuclides, separating interactions belonging to different events from each other and sorting the different interactions into the correct order. Once this is done, the location of incidence of the gamma rays should coincide with the location of the first interaction and the recovered scattered gamma ray trajectory is used to estimate the direction of incidence. As discussed in the foregoing, various techniques and algorithms can be used in this first step including, but not limited to, kinematical fitting and likelihood-based methods. Alternatively, or in addition, machine learning can be applied to the first step, to recover the photon incidence vector. For this application, boosted decision tree models have demonstrated success for Compton camera imaging in the past (Kozani & Magiera, 2022).

The second step of the image reconstruction for the detector system 1 could be based on various reconstruction algorithms including, but not limited to filtered back projection (Maxim, 2014), direct inversion (Maxim et al., 2009), iterative methods (Wilderman et al., 1998) and deep learning (Daniel et al., 2022; Yao et al., 2022). Machine learning methods, in particular deep-learning-based, can be applied to the second step, to enhance the image reconstruction from a dataset of estimated incidence vectors. In an embodiment, a conventional image reconstruction algorithm, such as filtered back projection, is first applied and then a neural network is used to enhance the resulting image. By training this neural network on pairs of noiseless ground truth images and simulated reconstructions from noisy data, the network is learnt to invert the blurring caused by the imaging system and reduce image noise, thereby improving the resulting image quality (Daniel et al., 2022; Yao et al., 2022). It is also possible to use a single machine-learning-based method that combines these two steps of image reconstruction. An alternative is to use back projections in the image reconstructions as a starting point for maximum likelihood iterative methods.

In an embodiment, the semiconductor sensors 120 are partly or fully depleted by an external electric field. In such an embodiment, the detector system 1 further comprises a field applying device configured to apply an electric field at least partly over the 3D semiconductor detector 100 so that the semiconductor sensors 120 in the 3D semiconductor detector 100 are at least partly depleted.

In an embodiment, the detector system 1 further comprises external field programmable gate arrays (FPGAs) interconnected between i) the 3D semiconductor detector 100 and/or the read-out circuitry and ii) the at least one processor 14 and/or the at least one memory 16.

Hence, such FPGAs can then be used as an interface between the 3D semiconductor detector 100 and/or the read-out circuitry and the at least one processor 14 and/or the at least one memory 16.

FIG. 5 is a schematic illustration of a detector system 1 according to an embodiment. The detector system 1 as shown in the figure comprises the 3D semiconductor detector 100 and a computer 10 comprising the at least one processor 14 and the at least one memory 16. The computer 10 in FIG. 5 has been shown with a single memory 16. The embodiments are, however, not limited thereto. In clear contrast, the computer 10 could comprise or be, wirelessly or with wire, connected to multiple memories 16, such as a memory system of multiple memories. The computer 10 also comprises a processor 14. The computer 10 further comprises a general input and output (I/O) unit 12 configured to communicate with external devices, such as the 3D semiconductor detector 100 and a display screen 18. The I/O unit 12 could represent a transmitter and receiver, or transceiver, configured to conduct wireless communication. Alternatively, or in addition, the I/O unit 12 could be configured to conduct wired communication and may then, for instance, comprise one or more input and/or output ports.

In an embodiment, the detector system 18 also comprises a display or display screen 18 wirelessly connected or connected by wire to the at least one processor 14 and/or the at least one memory 16, such as through the I/O unit 12. In such an embodiment, the image reconstructed by the at least one processor 14 can then be displayed on the display or display screen 18.

The term processor 14 should be interpreted in a general sense as any circuitry, system or device capable of executing program code or computer program instructions to perform a particular processing, determining or computing task. The processor 14 does not have to be dedicated to only execute the above-described steps, functions, procedure and/or blocks, but may also execute other tasks.

In an embodiment, the detector system 1 and 3D semiconductor detector 100 measures, per interaction in the 3D semiconductor detector 100, the induced Compton recoil electron track. The scattering of the Compton recoil electron along the electron track gives rise to electron-hole pairs inducing a signal (charge) that can be detected at the pixels 125 of the 3D semiconductor detector 100. The detected signal is measured and digitized and stored in the memory of the CMOS electronics, preferably at the semiconductor sensor 120 in the case of a monolithic semiconductor sensor 120. Each such Compton recoil electron can give rise to a detectable signal at one or a plurality of pixels 125 depending on the energy of the Compton recoil electron and the position of interaction in the 3D semiconductor sensor 120. This hit map of pixel signals is used to estimate the position, such as $\bar{r}=(x, y, z)$, of the interaction of the gamma ray, i.e., the start of the electron track. Furthermore, the detector system 1 and 3D semiconductor detector 100 estimates the time t of the interaction and the energy E that the gamma ray lost in the interaction, which energy corresponds to the kinetic energy gained by the Compton recoil electron, which corresponds to the number of electron-hole pairs induced by the Compton recoil electron along its electron track. The incident gamma ray then interacts n times in the 3D semiconductor detector 100 before leaving the 3D semiconductor detector 100, i.e., escape, or before being fully absorbed by photoelectric effect.

The detector system 1 thereby estimates the time, location and energy for all detected interactions k, i.e., $(t_k, \bar{r}_k, E_k)=(t_k, x_k, y_k, z_k, E_k)$, The energy of the incident gamma ray, $E_0$, is known since it is the result of the nuclear decay of the radionuclide, such as 140 keV for technetium-99m ($^{99m}$Tc) or 511 keV for positron annihilation.

The signals $(t_k, \bar{r}_k, E_k)$ obtained from all interactions are used by the detector system 1 to determine the correct order of the interactions, estimate the direction of the incident gamma ray at the first direction for the event and use the direction of the incident gamma ray to reconstruct the image of the distribution of radionuclides in an object, such as body a human subject.

The angular resolution for the detector system 1 is determined by the energy resolution and the spatial resolution at the component level. The energy resolution is dependent on the scattering angle and fundamentally limited by the so called "Doppler broadening", which is caused by the fact that the Compton recoil electron is not perfectly at rest and not free when hit by the incident gamma ray. The uncertainty in scattered gamma ray energy due to Doppler broadening was estimated by Matscheko et al. 1989 and the impact on Compton angular resolution from energy resolution in general was described by Martin et al. 1993. The impact from spatial resolution of detector was determined by Ordonez et al. 1993. A similar result is obtained for the 3D semiconductor detector using error propagation.

Figure 13:
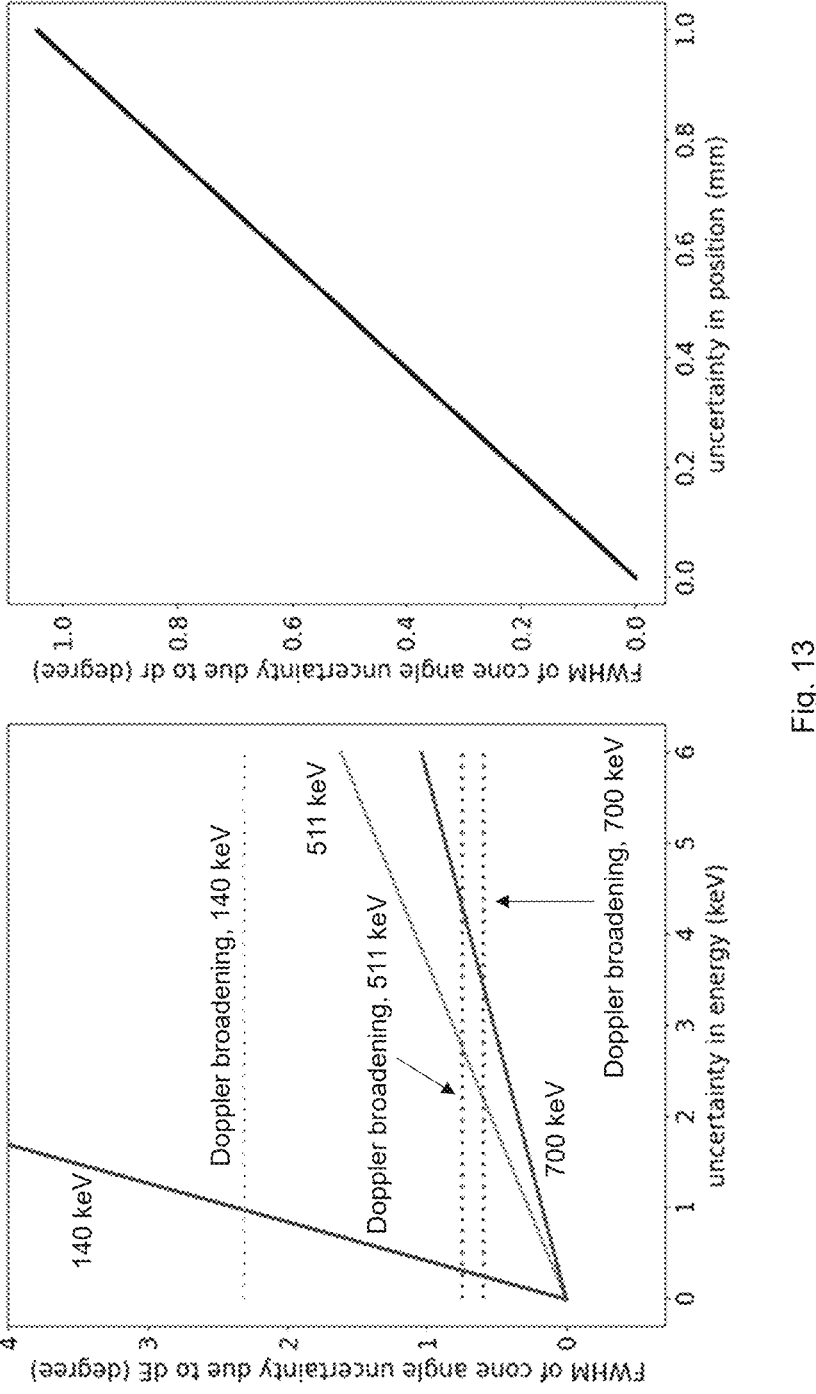
FIG. 13 illustrates of the effects of energy resolution and spatial resolution on the angular resolution FWHM for an event with two Compton scatter interactions and a 50° scatter angle of incident gamma rays with three different energies.

FIG. 13 shows the impact of energy resolution and spatial resolution on the uncertainty in the Compton cone angle for three event examples with incident energy of 140 keV, 511 keV and 700 keV. One opportunity with the 3D semiconductor detector 100 is to select events with favorable scattering for high resolution, creating a high-resolution image with a subset of events, and using the remaining events to improve the noise at lower spatial frequencies. That is, the spatial resolution for each event can be estimated and this information can be used to optimize the image reconstruction.

Figure 14:
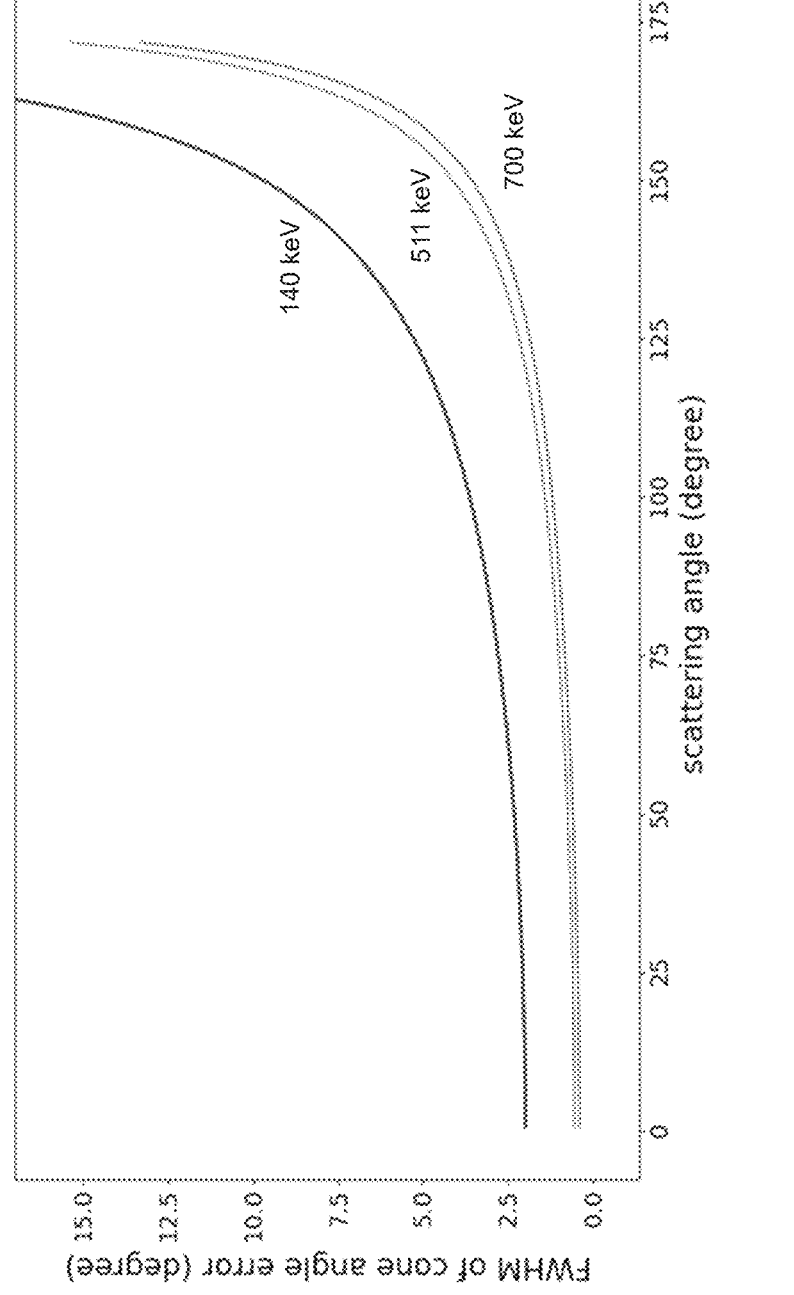
FIG. 14 illustrates the impact of Doppler broadening on angular resolution of the 3D semiconductor detector for different scattering angles.

The example in FIG. 13 is an event with two Compton scatter interactions and a 50° scattering angle of incident gamma rays with three different energies (140 keV, 511 keV, 700 keV). In this example, the source is 90 mm from the primary interactions, and the secondary interaction is 44 mm from the primary interaction. Resulting angular resolution full width at half maximum (FWHM) is plotted against energy resolution and spatial resolution. The Doppler broadening will be a limit for the energy resolution and is indicated with the dotted lines in FIG. 13. Targeted energy resolution for the detector system is around 300 eV and, thus, significantly lower than the Doppler broadening. Therefore, the angular resolution of detector system is expected to be close to the limit provided by the Doppler broadening. Position resolution for the interactions will be dominated by the depth coordinate in the silicon wafer thickness direction and is expected to be <100 μm, which means a negligible impact on the system angular resolution. FIG. 14 shows how this Doppler broadening effect on angular resolution FWHM changes with scattering angle.

Figure 15:
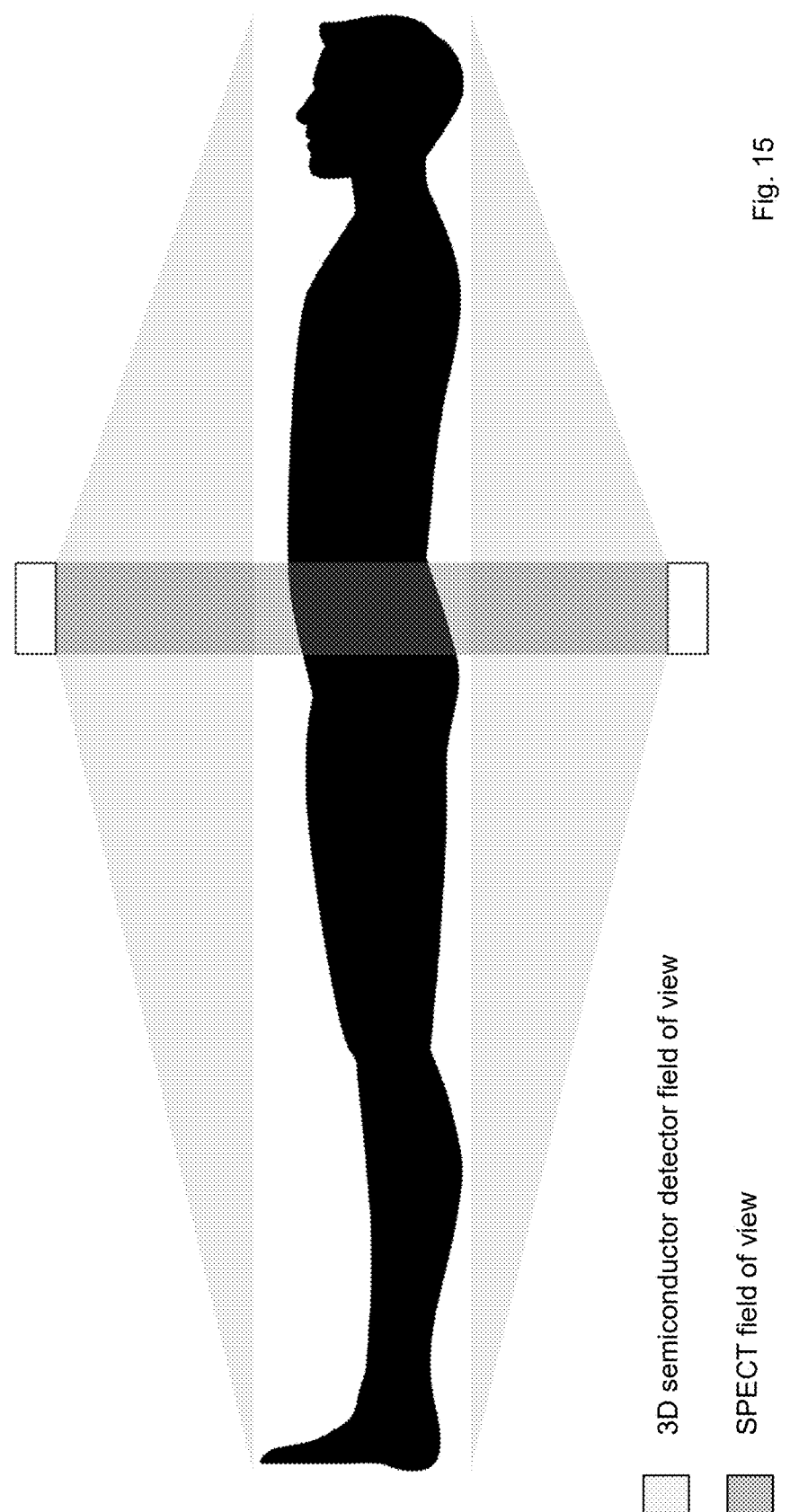
FIG. 15 compares field of view of the 3D semiconductor detector versus field of view of a SPECT detector.

A further potential advantage of the 3D semiconductor detector 100 and the detector system 1 of the embodiments is increased geometrical coverage given the same physical detector area as today's SPECT or PET systems. Normally, the PET axial coverage is 15 cm to 25 cm at a radius of 40 cm from the center of the system. Conventional SPECT systems typically have two detectors, each having an area<40×60 cm$^2$ and needs a rotation to collect data from different angles to obtain total tomographic coverage. In the case one wants to image the whole patient, several consecutive SPECT scans must be acquired and stitched together. For cancer metastasis detection, a common application in molecular imaging, the entire body needs to be scanned, most commonly with a continuous planar scan as a start and followed up with SPECT in areas with findings. The limited coverage corresponds to a dose penalty equivalent to around a factor 10. In contrast, the detector system 1 of the embodiments with the same area will accept gamma rays from a wide angle as shown in FIG. 15, which will translate into a corresponding dose advantage.

Table 3 summaries performance for state-of-the art SPECT and Compton cameras with the performance of an embodiment of the detector system 1.

TABLE 3

| performance data | | | |
| --- | --- | --- | --- |
| Detector system | Spatial resolution at 10 cm distance | Relative dose efficiency | Comment |
| Collimator SPECT | 10-20 mm | $1 \times 10^{-6}$ | Most common SPECT system |
| Collimator SPECT CdZnTe detector | 6-12 mm | $5 \times 10^{-6}$ | SPECT system with higher performing detector |
| Compton camera | 1-20 mm | $1 \times 10^{-3}$- $1 \times 10^{-6}$ | High resolution and high efficiency only for energies >500 keV |
| 3D semiconductor detector | 3.8 mm (140 keV) <1 mm (511 keV) | 1 | |

The 3D semiconductor detector 100 and the detector system 1 of the embodiments can be used in various medical and non-medical applications including SPECT systems, PET systems, in connection with radiopharmaceuticals, molecular imaging with radionuclide-labeled tracers and Imaging applications outside of medical imaging.

SPECT

Increased dose efficiency will lead to improved detection of low tracer concentrations. Combined with higher spatial resolution, the detector system 1 enables earlier detection of cancers and metastases, at a stage when treatment has a higher chance of success. The same probe label can be used for targeted drugs, and verification of the efficiency of the treatment can be performed. This can include so-called click chemistry, which can dramatically reduce the time it takes for the drug to reach the cancer target. The affinity to cancer is often low which prolongs the time for the labelled molecule to reach its target. If an intermediary click molecule is injected beforehand, it can attach to cancer over time without any risk to healthy tissue since there is no drug attached. In the second stage, the drug labelled with the click molecule can be injected and will quickly attach to the corresponding click target in the cancer with high affinity. Some click molecules can be labelled with radionuclides for imaging and much higher image quality will assist in optimizing the treatment.

Dynamic imaging is often not possible today due to limited statistics. However, the detector system 1 of the embodiments could enable this. If the efficiency of the detector system 1 is improved by a factor of $10^6$ as compared to prior art SPECT systems, in the same 10-minute time used today for a single image, this examination time can be split in a time series of $10^6$ consecutive 0.6 ms images. The uptake as a function of time often contains valuable diagnostic information.

The detector system 1 of the embodiment would also allow a dramatic reduction of the examination time as compared to prior art SPECT systems. Examinations taking between 10 min and 1 hour today could be reduced to <10 seconds and still have improved image quality. The long image time is particularly burdensome for very sick patients and sometimes prevents an examination from taking place. It would also increase the throughput in the clinic as well as allow research studies with more subjects.

Blurring of the image due to patient motion is a major limitation in diagnostic image quality today. Shortening the image acquisition will reduce the risk of motion artifacts. More importantly, the drastic improvement in efficiency will enable image acquisitions of <1 second that can be synchronized with the heart activity through electrocardiogram (ECG). Having access to a consecutive series of high image quality images will enable advanced methods for motion correction.

The increase in efficiency will also enable extreme low-dose imaging. The effective dose today for a SPECT examination is in the order of 0.5-25 mSv (excluding CT) and keeping other parameters, such as image acquisition time, the same an increased efficiency of $10^6$ would lead to a reduction in radiation dose to 5-25 nSv. The daily radiation dose from natural sources is around 9 nSv, and, thus, the radiation dose burden and risk with a SPECT examination performed with the detector system 1 of the embodiments would be almost negligible. Clinical trials for drug discovery using SPECT are often limited by the radiation risk and this will open up for more subjects and/or more follow up examinations. The cost of the labeled agent would also be much lower. This could translate into new opportunities such as screening for early cancer detection or other diseases.

SPECT today is limited in energy range since the collimator is a necessary component for geometrical accuracy. Even though high energy collimators with thicker walls are available—at some point around 300 keV they become inefficient and photon penetration of the walls become problematic. If use of higher energy gamma radiotracers can be enabled with the detector system 1 of the embodiments, this would result in less scatter in the object.

The spatial resolution would approach X-ray imaging, which adds important information when combining the anatomical image from CT or MR with a functional image from the detector system.

In general, the detector system 1 of the embodiments would open multimodality examinations with PET and other modalities, such as SPECT and PET modalities.

PET

The detector system 1 of the embodiments could add features to PET systems, such as a much higher spatial resolution detector. Since PET requires two 511 keV photons, it is enough if one of them scatters in the object for the event to be lost. This is very common and for large patients; more than 95% of the events are lost. With the detector system 1 of the embodiments the events with only one scattered gamma ray can be used, corresponding to a significant efficiency gain.

Radiopharmaceuticals

Radiopharmaceuticals can also be labeled with radionuclides that deposit more energy in the tissues where they are taken up, compared to those used for purely diagnostic purposes. This provides so-called targeted radionuclide therapy (Sgouros et al., 2020). Two examples are lutetium-177-Dotate ($^{177}$Lu-Dotatate), which is used for the treatment of neuroendocrine tumors, and $^{131}$I-MIBG, which is used for the treatment of neuroblastoma. $^{177}$Lu emits both electrons and 208 keV photons. $^{131}$I emits both electrons and 364 keV photons. The electrons give a local radiation treatment whilst the photons can be imaged using the detector system 1 of the embodiments, making it possible to image the treatment in real-time. This allows the assessment of treatment response, evaluation of tumor regression or progression, and optimization of subsequent treatment plans. Generally, activity levels for radiopharmaceutical treatment are in the range of 4-20 GBq, considerably higher than for imaging.

Metastatic cancer is difficult to treat, and targeted radionuclide therapy is one method that has shown good results and is gaining popularity. Conventional radiotherapy in combination with surgery can only be used when the cancer is localized. Some examples are iodine-131 ($^{131}$I) for hyperthyroidism, thyroid cancer, and non-Hodgkin's lymphoma, radium-223 ($^{223}$Ra) for bone metastases, lutetium-177 ($^{177}$Lu) for neuroendocrine tumors, yttrium-90 ($^{90}$Y) for non-Hodgkin's lymphoma and liver cancer. All these isotopes beta decay, and the radiation dose is provided by the emitted electron with a typical range of 2 mm to 5 mm. As the electron slows down, it causes emission of so-called bremsstrahlung, which has a continuous energy distribution from zero to the energy of the electron, ranging from 100 keV to 1000 keV. In connection with the decay, high energy gamma photons are also emitted. The radiation emitted at each decay is an opportunity to monitor the therapy as well as obtain diagnostic images showing the status of the cancer as the therapy is delivered. Actinium-225 ($^{225}$Ac) is used for targeted alpha therapy for prostate cancer and the emitted alpha particle, with a range <100 μm, is not associated with any bremsstrahlung. The alpha decay of $^{225}$Ac triggers a chain of events associated with gamma emission, for example at 440 keV that can be used for imaging. The energy of the gamma rays associated with targeted radionuclide therapy is high and challenging to image with today's Anger cameras. The performance of the detector system 1 of the embodiments is stable for higher energies and adding a high-resolution diagnostic method to the therapy can be a game-changer in calculating the local radiation dose and optimizing the treatment at an individual level.

Molecular Imaging With Radionuclide-Labeled Tracers

A multitude of radionuclide-labeled tracers are available for imaging physiological and pathophysiological processes in the human body, most commonly technetium-99m ($^{99m}$Tc) at 140 keV but also at higher energies, such as iodine-131 ($^{131}$I) at 364 keV. In principle, isotopes associated with higher energies, several MeV, could also be used, but with today's instrumentation, they are hard to detect. The detector system 1 of the embodiments could, however, be used with such isotopes with higher energies.

The detector system 1 of the embodiments can be used for molecular imaging using multiple different radionuclides. Such an approach enables monitoring of multiple biological processes at the same time in an object, typically an animal subject and more preferably a human subject.

Imaging Applications Outside of Medical Imaging

The detector system 1 of the embodiments could be used for environmental monitoring or homeland security applications, tracking dedicated molecules. Also, application in astronomy could work, potentially in conjunction with recently invented x-ray optics (Mi et al., 2019).

Example

This Example investigated a new detector design that would further increase the detector efficiency and spatial resolution, which also leads to a larger number of photons interacting within the detector volume. This Example investigated event coincidences in a 3D semiconductor detector for gamma rays with energy 140 keV and 510 keV using GEANT4 for activities ranging from 5 MBq to 500 MBq. Firstly, the time resolution of the within the detector volume was varied, fixing other parameters, to assess its influence on the number of coincident events. Then the time resolution was fixed to 2 ns while varying activity of the source, gamma ray energies and detector thickness, to investigate coincident events and their spatial distribution. Lastly, given some estimates of the electron track lengths, the average number of activated voxels in a 100 ns window was calculated. The results indicated that the use of an algorithm based on spatial and kinematic considerations could help drastically reduce the event coincidences, and that even at high source activity, the number of activated voxels in the selected time interval remained negligible.

Materials and Methods

Figure 17:
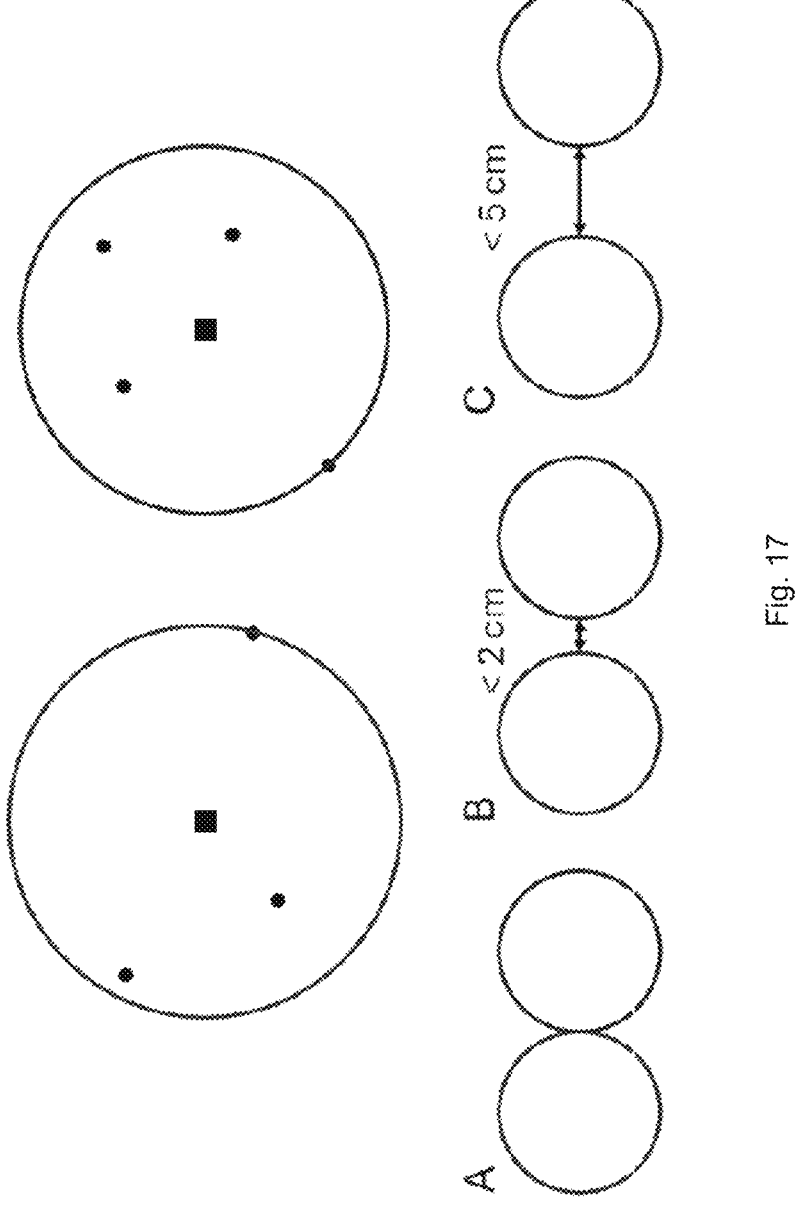
FIG. 17 shows, on the top, an illustrative case where two events have respectively 3 and 4 interactions (black dots). The black square represents the centroid, and the sphere is centered in it with a radius equal to the distance from the centroid to the furthest interaction point. The three categories of spatial coincidences are shown below: overlap of the volumes (A), surface of the spheres closer than 2 cm (B), or than 5 cm (C).

The set-up was simulated with GATE software, which is based on the GEANT4 toolkit. The 3D semiconductor detector was simulated as a solid block of semiconductor material (which in this case was set to silicon), with an area of 400 cm$^2$, a thickness of 2 cm and 5 cm, and the voxels size was set to 25×25×700 μm$^3$. An isotropic point-like source with energies of 140 KeV and 511 KeV and activity ranging from 5 MBq to 500 MBq was located 15 cm from the detector surface and embedded in a water cylinder with a diameter of 30 cm, a height of 120 cm and rotational axis parallel to the detector surface. The data was then analyzed in python. For an event coincidence to take place, it is meant that two (or more) different photons interact in the 3D semiconductor detector in a time interval smaller than the time resolution. To test the effect of different time resolutions on the number of time coincident events, 85000 emitted gamma rays were simulated for each tested time resolution. To estimate if two time coincident events were also spatially coincident, an algorithm was employed as illustrated in FIG. 17, approximating the volume of each even with a sphere containing all interaction points, and assessing the relative distance between the two spheres. The time coincident events were then divided in 3 categories: overlap of the volumes (A), surface of the spheres closer than 2 cm (B) or 5 cm (C). A total of 250000 photons were simulated for this second analysis for every combination of parameters, while the time resolution was kept fixed at 2 ns.

In the third simulation, to determine how many voxels were activated, 3000 intervals of 100 ns were simulated. For each of them, the true position of each interaction in the detector was registered, together with the deposited energy. From previous electron track analysis, the average number of voxels activated in an interaction given a certain electron energy was known. This information was used together with the registered positions and energies to estimate how many voxels would fire up in each 100 ns interval, given a time resolution of 2 ns.

Results

Figure 18:
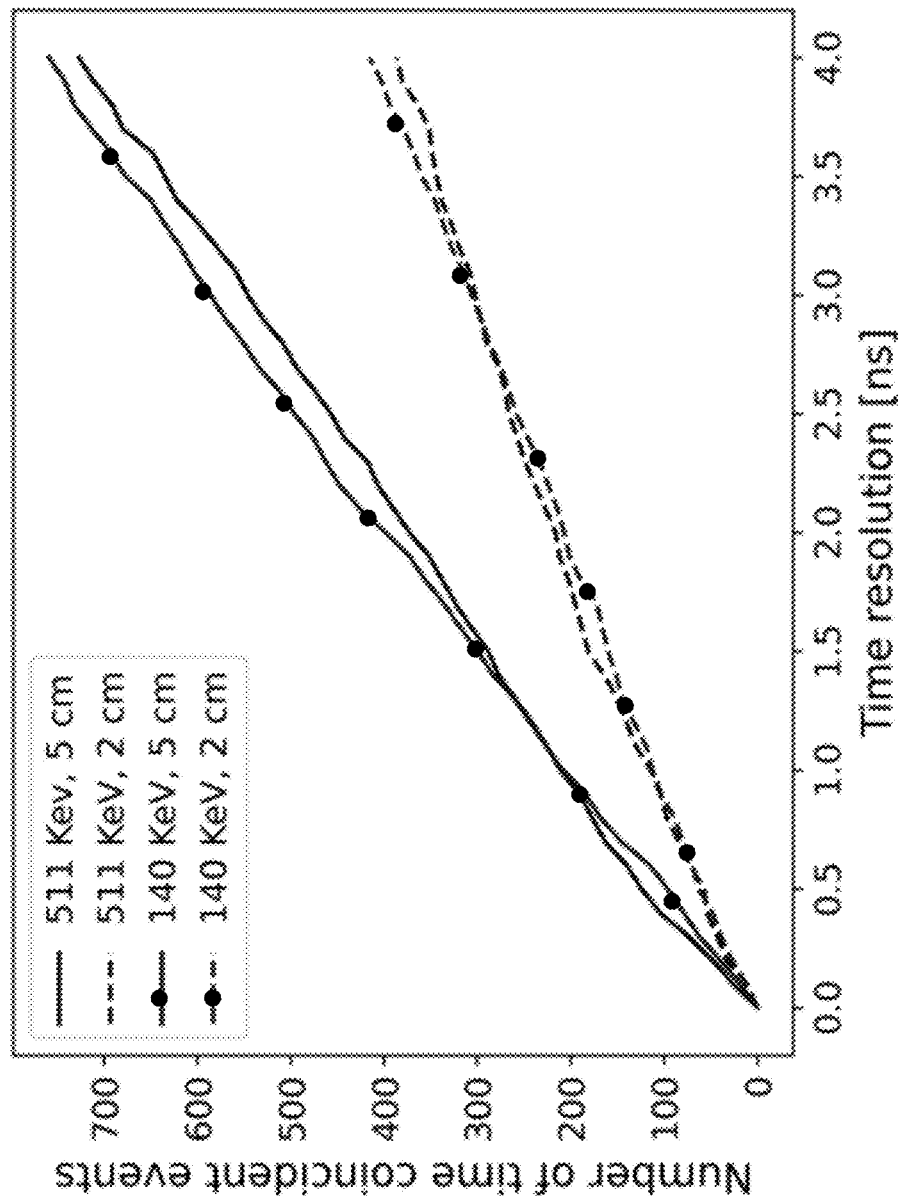
FIG. 18 illustrates number of time coincident events from time resolution sweeps. In the four cases tested the activity of the source was kept fixed at 500 MBq while its energy and the detector thickness were varied.

The results from the time resolution sweeps are present in FIG. 18. For the four different cases a linear relationship between time resolution and number of time coincident events was evident, with no major difference in energy. On the other hand, the detector thickness decrease to 2 cm appeared to also decrease the number of coincident events.

Regarding the event coincidences analysis with the spatial algorithm, the results are presented in Table 4. The percentage was computed as the number of events involved in the respective coincidences, divided by the total number of gamma rays interacting with the 3D semiconductor detector.

TABLE 4

Results for the analysis of simulations with different parameters and fixed time resolution of 2 ns.

| | Time coincident events | Coincident events A | Coincident events B | Coincident events C |
|---|---|---|---|---|
| 511 keV | | | | |
| 5 cm 500 MBq | 25.1% | 1.79% | 3.70% | 8.12% |
| 5 cm 50 MBq | 3.19% | 0.146% | 0.417% | 1.02% |
| 5 cm 5 MBq | 0.441% | 0.021% | 0.063% | 0.168% |
| 2 cm 500 MBq | 23.8% | 1.11% | 2.33% | 6.72% |
| 2 cm 50 MBq | 2.39% | 0.0784% | 0.235% | 0.510% |
| 2 cm 5 MBq | 0.198% | 0% | 0% | 0.0396% |
| 140 keV | | | | |
| 5 cm 500 MBq | 26.7% | 0.984% | 2.58% | 7.28% |
| 5 cm 50 MBq | 2.48% | 0.0456% | 0.189% | 0.456% |
| 5 cm 5 MBq | 0.395% | 0.0232% | 0.0232% | 0.116% |
| 2 cm 500 MBq | 24.0% | 0.716% | 2.11% | 6.29% |
| 2 cm 50 MBq | 2.55% | 0.037% | 0.185% | 0.481% |
| 2 cm 5 MBq | 0.337% | 0% | 0% | 0% |

The results show that in all cases, the percentage of time coincident events remained limited to 26% for the highest activity case. However, taking into account spatial considerations it would be possible to decrease the percentage, allowing for more events to be separated and correctly reconstructed. While this is a preliminary algorithm it served as good estimate of how much improvement could be achieved by keeping into account the spatial distribution of the interactions as well as the kinematics and deposited energies.

Lastly the number of activated voxels for an activity level of 500 MBq is shown in Table 5.

TABLE 5

Given a fixed time resolution of 2 ns, the results for the number of activated voxels after analyzing 3000 intervals of 100 ns each

| 500 MBq | Minimum* | Maximum* | Mean | Median |
|---|---|---|---|---|
| 511 keV 5 cm | 0 | 408.9 | 85.4 | 76.5 |
| 511 keV 2 cm | 0 | 254.4 | 42.1 | 76.5 |
| 140 keV 5 cm | 0 | 200.1 | 41.6 | 32.7 |
| 140 keV 2 cm | 0 | 116.6 | 25.5 | 22.6 |

*The minimum and maximum values refer to the 3000 intervals

In all cases analyzed, the number of activated voxels remained orders of magnitude smaller than the total number of voxels in the detector (around 4.6 billion for 5 cm thick detector and 1.8 billion for the 2 cm thick case).

From the data, it was possible to conclude that a linear relationship was present between time resolution and number of time coincident events. Moreover, to reduce the number of coincident events it would be beneficial as shown, to develop an algorithm based on geometrical and kinematic considerations. Lastly, given the small number of voxels activated in the considered time window power consumption in connection with voxel read-out could be reduced.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible.

REFERENCES

Caputo, All-sky Medium Energy Gamma-ray Observatory explorer mission concept, J. *Astron. Telesc Instrum. Syst.* 2022 8(4): 044003-1

Cartier et al., Micrometer-resolution imaging using MÖNCH: towards $G_2$-less grating interferometry, *Journal of Synchrotron Radiation* 2016 23: 1462-1473

Corradino et al., Design and Characterization of Backside Termination Structures for Thick Fully-Depleted MAPS, *Sensors* 2021 21: 3809

Corradino et al., Charge Collection Dynamics of the ARCADIA Passive Pixel Arrays: Laser Characterization and TCAD Modeling, *Front. Phys.* 2022 10: 929251

Corradino et al., ARCADIA MAPS process qualification through the electrical characterization of passive pixel arrays, *Journal of Instrumentation* 2023 18: C02045

Corradino et al., Simulation and first characterization of MAPS test structures with gain for timing applications, *Journal of Instrumentation* 2024 19: C02036

Daniel et al., Application of a deep learning algorithm to Compton imaging of radioactive point sources with a single planar CdTe pixelated detector, *Nuclear Engineering and Technology,* 2022 54: 1747-1753

De Cilladi et al., Fully Depleted Monolithic Active Microstrip Sensors: TCAD Simulation Study of an Innovative Design Concept, *Sensors* 2021 21: 1990

Kozani and Magiera, Machine learning-based event recognition in SiFi Compton camera imaging for proton therapy monitoring, *Phys. Med. Biol.* 2022 67: 155012

Kroeger et al., Three-Compton Telescope: Theory, Simulations, and Performance, *IEEE Transactions on Nuclear Science,* 2002 49(4): 1887-1892

Lee et al., Evaluation of sequence tracking methods for Compton cameras based on CdZnTe arrays, *Nuclear Engineering and Technology,* 2021 53: 4080-4092

Martin et al., A ring Compton scatter camera for imaging medium energy gamma rays, *IEEE Transactions on Nuclear Science,* 1993 40(4): 972-978

Matscheko et al., Compton spectroscopy in the diagnostic x-ray energy range. II. Effects of scattering material and energy resolution, *Phys Med Biol.* 1989 34(2): 199-208

Maxim et al., Analytical inversion of the Compton transform using the full set of available projections, *Inverse Problems,* 2009 25(9): 095001

Maxim, Filtered backprojection reconstruction and redundancy in Compton camera imaging, *IEEE Trans. Image Process.,* 2014 23(1): 332-341

Mi et al., A stacked prism lens concept for next-generation hard X-ray telescopes, *Nature Astronomy* 2019 3: 867-872

Neubüser et al., Sensor design optimization of innovative low-power, large area FD-MAPS for HEP and applied science, *Front. Phys.* 2021 9: 625401

Neubüser et al., Impact of X-ray induced radiation damage on FD-MAPS of the ARCADIA project, *Journal of Instrumentation* 2022 17: C01035

Neubüser et al., ARCADIA FD-MAPS: Simulation, characterization and perspectives for high resolution timing applications, *Nuclear Inst. And Methods in Physics Research, A* 2023a 1048: 167946

Neubüser et al., First characterization results of ARCADIA FD-MAPS after X-ray irradiation, *Journal of Instrumentation* 2023b 18: C01066

Ordonez et al., Angular uncertainties due to geometry and spatial resolution in Compton cameras, 1998 *IEEE Nuclear Science Symposium Conference Record.* 1998 IEEE Nuclear Science Symposium and Medical Imaging Conference (Cat. No. 98CH36255), Toronto, ON, Canada, 1998, vol. 3, pp. 1535-1540

Pancheri et al., Design of CMOS Monolithic Avalanche Detectors for charged-particle timing with sub-nanosecond resolution, *IEEE EUROCON 2023—20th International Conference on Smart Technologies*, 6-8 Jul. 2023

Peric et al., High-Voltage CMOS Active Pixel Sensor, *IEEE Journal of Solid-State Circuits*, 2021 56(8): 2488-2502

Sgouros et al., Radiopharmaceutical therapy in cancer: clinical advances and challenges, *Nat Rev Drug Discov.*, 2020 19: 589-608

Sundberg et al., 1-μm spatial resolution in silicon photon-counting CT detectors, *J. Med. Imag.* 2021 8(6): 063501

Sundberg et al., Compton coincidence in silicon photon-counting CT detectors, *Journal of Medical Imaging*, 2022, 9(1): 013501

Taschenov and Gerl, TANGO—New tracking AlGOrithm for gamma-rays, *Nuclear Instruments and Methods in Physics Research A*, 2010, 622: 592-601

Takashima et al., Event reconstruction of Compton telescopes using a multi-task neural network, *Nuclear Inst. And Methods in Physics Research A*, 2022, 1038: 166897

Wilderman et al., List-Mode Maximum Likelihood Reconstruction of Compton Scatter Camera Images in Nuclear Medicine, *IEEE Conference Record of Nuclear Science Symposium* 1998 3: 1716-1720

Yao et al., Technical note: Rapid and high-resolution deep learning-based radiopharmaceutical imaging with 3D-CZT Compton camera and sparse projection data, *Med Phys.* 2022; 49: 7336-7346

Yoneda et al., Reconstruction of multiple Compton scattering events in MeV gamma-ray Compton telescopes towards GRAMS: The physics-based probabilistic model, *Astroparticle Physics*, 2023, 144: 102765

What is claimed is:

1. A detector system for molecular imaging of a radionuclide, comprising:

a three-dimensional (3D) semiconductor detector comprising a plurality of sensor stacks, wherein each sensor stack of the plurality of sensor stacks comprises a plurality of semiconductor sensors each comprising a plurality of pixels, wherein the plurality of semiconductor sensors is made of a semiconductor material having an average atomic number Z below 40;

a read-out circuitry connected to the pixels in the 3D semiconductor detector and configured to output a pixel value from a pixel in a semiconductor sensor of the 3D semiconductor detector if the pixel value exceeds a cutoff threshold and if the pixel and at least one adjacent pixel in the semiconductor sensor both detect an interaction within a defined time interval, wherein pixel values are representative of a respective energy deposited at a pixel by an interaction induced by an incident gamma ray in the 3D semiconductor detector;

at least one processor; and at least one memory comprising instructions, which when executed by the at least one processor, cause the at least one processor to:

predict, based on the pixel values output by the read-out circuitry, the interactions in the 3D semiconductor detector belonging to a same event induced by the incident gamma ray;

estimate, based on the predicted interactions in the 3D semiconductor detector belonging to the same event, a direction of the incident gamma ray inducing the same event; and reconstruct an image based on the estimated directions of incident gamma rays.

2. The detector system according to claim 1, wherein the read-out circuitry is configured to:

compare the pixel value with the cutoff threshold; and output the pixel value of the pixel if the pixel value exceeds the cutoff threshold and if the pixel and the at least one adjacent pixel in the semiconductor sensor both detect an interaction within the defined time interval.

3. The detector system according to claim 1, wherein the read-out circuitry is configured to not output the pixel value if the pixel value exceeds the cutoff threshold, but is below a read-out threshold, if no adjacent pixel in the semiconductor sensor detects an interaction within the defined time interval.

4. The detector system according to claim 3, wherein the read-out circuitry is configured to output the pixel value if the pixel value exceeds the read-out threshold even if no adjacent pixel in the semiconductor sensor detects an interaction within the defined time interval.

5. The detector system according to claim 1, wherein the read-out circuity is configured to assign a time of arrival (TOA) to the pixel value if the pixel value is output by the read-out circuity.

6. The detector system according to claim 5, further comprising at least one TOA circuitry configured to assign the time of interaction to the pixel value.

7. The detector system according to claim 6, further comprising at least one TOA circuitries per semiconductor sensor, wherein each TOA circuitry of the at least one TOA circuitries is shared by a respective set of multiple pixels in the semiconductor sensor and is configured to assign the time of arrival to pixel values of pixels belonging to the respective set of multiple pixels.

8. The detector system according to claim 5, wherein the at least one memory comprising instructions, which when executed by the at least one processor, cause the at least one processor to:

group interactions having a respective time, represented by the time of arrival, within a time interval; and predict, based on the pixel values output by the read-out circuitry, the interactions in the 3D semiconductor detector belonging to the same event induced by the incident gamma ray among the grouped interactions.

9. The detector system according to claim 1, wherein the read-out circuitry comprises a sample and hold circuitry configured to temporarily store pixel values; and the read-out circuitry is configured to flag pixel values stored in the sample and hold circuitry for read-out if the pixel value exceeds the cutoff threshold and if the pixel and at least one adjacent pixel in the semiconductor sensor detect an interaction within the defined time interval.

10. The detector system according to claim 1, further comprising at least one analog-to-digital converter (ADC) configured to digitize pixel values output by the read-out circuitry.

11. The detector system according to claim 10, further comprising a plurality of ADCs per semiconductor sensor, wherein each ADC of the plurality of ADCs is shared by a respective set of multiple pixels in the semiconductor sensor and is configured to digitize pixel values of pixels belonging to the respective set of multiple pixels.

12. The detector system according to claim 1, wherein the read-out circuitry is configured to generate position information for pixel values output by the read-out circuitry, wherein the position information represents pixel coordinates of the pixel in the semiconductor sensor.

13. The detector system according to claim 1, wherein a pixel value is representative of an energy deposited at the pixel by a Compton recoil electron along an electron track in the 3D semiconductor detector, wherein the Compton recoil electron is created by a Compton scatter interaction induced by the incident gamma ray in the 3D semiconductor detector; and the at least one memory comprising instructions, which when executed by the at least one processor, cause the at least one processor to predict a position of a start of the electron track based on a distribution of the energies deposited at each pixel along the electron track in the 3D semiconductor detector.

14. The detector system according to claim 1, wherein the at least one memory comprising instructions, which when executed by the at least one processor, cause the at least one processor to sort the predicted interactions in the 3D semiconductor detector belonging to the same event in an order of consecutive interactions based on the pixel values output by the read-out circuitry.

15. The detector system according to claim 1, wherein the at least one memory comprising instructions, which when executed by the at least one processor, cause the at least one processor to predict an initial interaction of the same event induced by the gamma ray track in the 3D semiconductor detector based on the pixel values output by the read-out circuitry.

16. The detector system according to claim 1, wherein the at least one memory comprising instructions, which when executed by the at least one processor, cause the at least one processor to predict, based on the pixel values output by the read-out circuitry, the interactions in the 3D semiconductor detector belonging to the same event induced by the incident gamma ray in the 3D semiconductor detector by imposing kinematic constraints on the Compton scattered gamma ray.

17. The detector system according to claim 16, wherein the interactions in the 3D semiconductor detector comprise at least one Compton scatter interaction; and the at least one memory comprising instructions, which when executed by the at least one processor, cause the at least one processor to:

estimate, based on the pixel values output by the read-out circuitry and for each Compton scatter interaction in the 3D semiconductor detector, a momentum of a Compton recoil electron induced by the Compton scatter interaction in the 3D semiconductor detector; and calculate a kinematic constraint for the Compton scatter interaction based on the estimated momentum of the Compton recoil electron.

18. The detector system according to claim 17, wherein the at least one memory comprising instructions, which when executed by the at least one processor, cause the at least one processor to estimate, based on the pixel values output by the read-out circuitry and for each Compton scatter interaction in the 3D semiconductor detector, the momentum of the Compton recoil electron by linear fit.

19. The detector system according to claim 17, wherein the at least one memory comprising instructions, which when executed by the at least one processor, cause the at least one processor to calculate an opening angle of a constrained cone based on the estimated momentum of the Compton recoil electron; and the constrained cone restricts the volume in the 3D semiconductor detector, within which a next interaction belonging to the same event induced by the incident gamma ray is allowed to take place.

20. The detector system according to claim 1, wherein the at least one memory comprising instructions, which when executed by the at least one processor, cause the at least one processor to estimate the direction of the incident gamma ray by a maximum likelihood estimation based on the pixel values read-out by the output circuitry for the predicted interactions in the 3D semiconductor detector belonging to the same event induced by the incident gamma ray.

21. The detector system according to claim 20, wherein the at least one memory comprising instructions, which when executed by the at least one processor, cause the at least one processor to estimate, the direction of the incident gamma ray by maximizing $\mathcal{L}(\theta){=}P(E_1, \bar{r}_1|\theta_1, E_0){\times}P(E_2, \bar{r}_2|\theta_2, E_1, \bar{r}_1){\times} \ldots {\times}P(E_n, \bar{r}_n|\theta_n, E_{n-1}, \bar{r}_{n-1})$, wherein $E_k$, $\bar{r}_k$, $\theta_k$ represent energy, position and incident angle of interaction number k, k=1 . . . n and n represents a last interaction of the same event, and $E_0$ represents an energy of the incident gamma ray.

22. The detector system according to claim 1, wherein each semiconductor sensor of the plurality of semiconductor sensors comprises:

a plurality of electrodes;

at least one counter electrode; and an electric field circuitry connected to the plurality of electrodes and the least one counter electrode and configured to apply a bias voltage between each electrode of the plurality of electrodes and a counter electrode of the at least one counter electrode.

23. The detector system according to claim 1, wherein the plurality of semiconductor sensors comprises complementary metal oxide semiconductor (CMOS) electronics comprising an application specific integrated circuit (ASIC) comprising analogue to digital converts (ADCs) and the read-out circuitry.

24. The detector system according to claim 23, wherein each semiconductor sensor of the plurality of semiconductor sensors is a monolithic semiconductor sensor integrating the CMOS electronics and the plurality of pixels on the monolithic semiconductor sensor.

25. The detector system according to claim 23, wherein each semiconductor sensor of the plurality of semiconductor sensors is a hybrid semiconductor sensor comprising the CMOS electronics flip chipped at a side of the plurality of pixels in the semiconductor sensor.

26. The detector system according to claim 1, wherein the plurality of semiconductor sensors is made of a semiconductor material having an average atomic number Z below 35.

27. The detector system according to claim 1, wherein the semiconductor material is selected from the group consisting of germanium, gallium arsenide, selenium, and silicon.

28. The detector system according to claim 1, wherein the 3D semiconductor detector is a 3D silicon detector and each sensor stack of the plurality of sensor stacks comprises a plurality of silicon sensors reach comprising a plurality of pixels.

\* \* \* \* \*